United States Patent
Lee

(10) Patent No.: US 8,916,875 B2
(45) Date of Patent: Dec. 23, 2014

(54) SEMICONDUCTOR PACKAGES

(75) Inventor: Jongjoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/419,935

(22) Filed: Mar. 14, 2012

(65) Prior Publication Data

US 2012/0248439 A1    Oct. 4, 2012

(30) Foreign Application Priority Data

Mar. 29, 2011  (KR) .......................... 10-2011-0028319

(51) Int. Cl.
| | | |
|---|---|---|
| H01L 23/58 | (2006.01) | |
| H01L 23/02 | (2006.01) | |
| H01L 23/498 | (2006.01) | |
| H01L 23/00 | (2006.01) | |
| H01L 25/03 | (2006.01) | |
| H01L 23/31 | (2006.01) | |
| H01L 25/065 | (2006.01) | |
| H01L 25/18 | (2006.01) | |
| H01L 21/66 | (2006.01) | |

(52) U.S. Cl.
CPC .......... *H01L 23/49838* (2013.01); *H01L 24/73* (2013.01); *H01L 25/03* (2013.01);

(Continued)

(58) Field of Classification Search
USPC ................................................... 257/48, 686
See application file for complete search history.

(56) References Cited

U.S. PATENT DOCUMENTS 7,148,505 B1 *  12/2006  Kuang ............................ 257/48
7,586,182 B2 *   9/2009  Baek et al. ..................... 257/686

(Continued)

FOREIGN PATENT DOCUMENTS

| JP | 2008-147670 A | 6/2008 |
| JP | 4191167 B2 | 9/2008 |

(Continued)

*Primary Examiner* — David Zarneke

(74) *Attorney, Agent, or Firm* — Sughrue Mion, PLLC

(57) ABSTRACT

Provided is a semiconductor package and a chip package of the same. The semiconductor package includes: a first semiconductor chip mounted on a first package substrate; a chip package stacked on the first semiconductor chip; and a first terminal connecting the chip package directly and electrically to the first semiconductor chip, wherein the chip package includes a second semiconductor chip mounted on a second package substrate, and the second package substrate includes a first pad coupled to the first terminal and a second pad electrically connected to the first pad and electrically spaced apart from the first terminal.

16 Claims, 19 Drawing Sheets

(52) U.S. Cl.
CPC ... *H01L 2924/37001* (2013.01); *H01L 23/3128* (2013.01); *H01L 23/49816* (2013.01); *H01L 24/05* (2013.01); *H01L 24/13* (2013.01); *H01L 24/14* (2013.01); *H01L 24/16* (2013.01); *H01L 24/29* (2013.01); *H01L 24/32* (2013.01); *H01L 24/48* (2013.01); *H01L 25/0652* (2013.01); *H01L 25/0657* (2013.01); *H01L 25/18* (2013.01); *H01L 2224/0401* (2013.01); *H01L 2224/04042* (2013.01); *H01L 2224/05009* (2013.01); *H01L 2224/0557* (2013.01); *H01L 2224/131* (2013.01); *H01L 2224/14181* (2013.01); *H01L 2224/16146* (2013.01); *H01L 2224/16225* (2013.01); *H01L 2224/2919* (2013.01); *H01L 2224/29191* (2013.01); *H01L 2224/32145* (2013.01); *H01L 2224/32225* (2013.01); *H01L 2224/48227* (2013.01); *H01L 2224/73207* (2013.01); *H01L 2224/73253* (2013.01); *H01L 2224/73265* (2013.01); *H01L 2225/0651* (2013.01); *H01L 2225/06517* (2013.01); *H01L 2225/06596* (2013.01); *H01L 2924/1431* (2013.01); *H01L 2924/1434* (2013.01); *H01L 2924/15311* (2013.01); *H01L 2924/157* (2013.01); *H01L 2924/15787* (2013.01); *H01L 2924/15788* (2013.01); *H01L 2924/1579* (2013.01); *H01L 2225/06513* (2013.01); *H01L 2225/06541* (2013.01); *H01L 2225/06565* (2013.01); *H01L 2924/15791* (2013.01); *H01L 22/32* (2013.01)
USPC ............................................. 257/48; 257/686

(56) References Cited

U.S. PATENT DOCUMENTS

| | | | |
|---|---|---|---|
| 7,638,362 B2 | 12/2009 | Ishino et al. | |
| 8,022,555 B2 | 9/2011 | Hwang et al. | |
| 8,035,235 B2 * | 10/2011 | Jang et al. | 257/787 |
| 8,242,794 B2 * | 8/2012 | Cho | 324/754.03 |
| 8,558,395 B2 * | 10/2013 | Khan et al. | 257/778 |
| 8,698,297 B2 * | 4/2014 | Bae et al. | 257/686 |
| 2005/0258853 A1 * | 11/2005 | Sorimachi | 324/763 |
| 2006/0071665 A1 * | 4/2006 | Blake et al. | 324/464 |
| 2008/0136007 A1 | 6/2008 | Kim et al. | |
| 2008/0246162 A1 | 10/2008 | Kwon et al. | |
| 2009/0223043 A1 * | 9/2009 | Hsu et al. | 29/830 |
| 2010/0133534 A1 * | 6/2010 | Do et al. | 257/48 |
| 2010/0244219 A1 | 9/2010 | Pagaila et al. | |
| 2014/0014958 A1 * | 1/2014 | Oh et al. | 257/48 |

FOREIGN PATENT DOCUMENTS

| | | |
|---|---|---|
| KR | 10-2008-0002449 A | 1/2008 |
| KR | 10-2008-0053234 A | 6/2008 |
| KR | 10-2008-0090268 A | 10/2008 |
| KR | 10-0923562 B1 | 10/2009 |
| KR | 10-0961309 B1 | 6/2010 |
| KR | 10-2010-0108296 A | 10/2010 |

\* cited by examiner

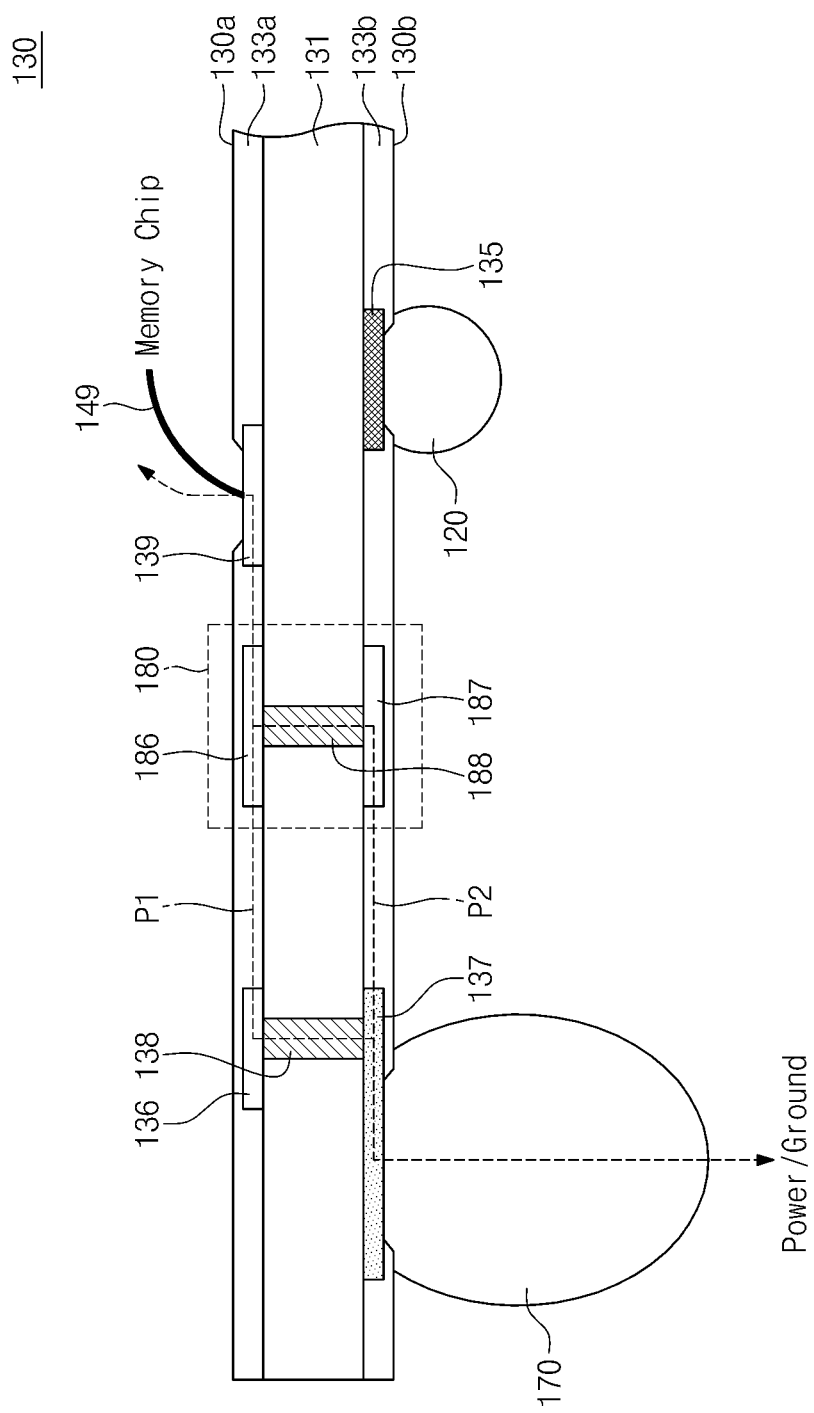

SEMICONDUCTOR PACKAGES

CROSS-REFERENCE TO RELATED APPLICATIONS

This U.S. non-provisional patent application claims priority under 35 U.S.C. §119 from Korean Patent Application No. 10-2011-0028319, filed on Mar. 29, 2011 in the Korean Intellectual Property Office, the entire contents of which are hereby incorporated by reference.

BACKGROUND

1. Field

Apparatuses and methods consistent with exemplary embodiments relate generally to a semiconductor device, and more particularly, to semiconductor packages.

2. Description of the Related Art

In the semiconductor industry, integrated circuit packaging technology is making continual progress to satisfy needs for miniaturized packaging solutions. For instance, multi-chip package techniques, which involve packaging a plurality of semiconductor chips into a single package structure, have been studied.

Among the multi-chip package techniques, special attention has been paid to a system-in-package (SiP) or package-in-package (PiP) technique, which involves packaging a plurality of semiconductor chips with different functions into a single package structure. Accordingly, there is a growing need for improvement of the multi-chip package techniques in terms of operation or function.

SUMMARY

One or more exemplary embodiments provide a semiconductor package with improved electric characteristics.

One or more exemplary embodiments provide a semiconductor package with improved yield.

According to an aspect of an exemplary embodiment, there is provided a semiconductor package including: a first semiconductor chip mounted on a first package substrate; a chip package stacked on the first semiconductor chip, the chip package including a second semiconductor chip mounted on a second package substrate; and a first terminal connecting the chip package directly and electrically to the first semiconductor chip. The second package substrate may include at least one first pad coupled to the first terminal and at least one second pad electrically connected to the first pad and electrically spaced apart from the first terminal.

In some exemplary embodiments, the second package substrate may further include at least one third pad electrically connected to the second semiconductor chip and the at least one third pad may be electrically connected to the at least one first pad via the at least one second pad.

In other exemplary embodiments, the second package substrate includes a top surface mounted with the second semiconductor chip and a bottom surface opposite the top surface. The first and second pads may be disposed on the bottom surface of the second package substrate and the third pad may be disposed on the top surface of the second package substrate.

In still other exemplary embodiments, the at least one first pad, the at least one second pad, and the at least one third pad may be respectively provided in plural, and the second pads may be larger in at least one of size and pitch compared to the first pads.

In even other exemplary embodiments, the number of the at least one second pad may be equal to the number of the at least one first pad.

In yet other exemplary embodiments, the at least one first terminal may include a plurality of first terminals interposed between the bottom surface of the second package substrate and the first semiconductor chip.

In further exemplary embodiments, the semiconductor package may further include at least one second terminal interposed between the first package substrate and the second package substrate. The at least one second terminal may be connected to the at least one second pad to connect the chip package directly and electrically with the first package substrate.

In still further exemplary embodiments, the plurality of the first terminals may be configured to establish transmission paths of data signals between the first semiconductor chip and the chip package, and the second terminal may be configured to establish a transmission path of at least one of a power signal and a ground signal between the first package substrate and the chip package.

In even further exemplary embodiments, the second package substrate may further include a plurality of first vias penetrating the second package substrate, which may electrically connect the plurality of the second pads to the plurality of the third pads.

In yet further exemplary embodiments, the second package substrate may further include a second via penetrating the second package substrate. The second via may be electrically connected to one of the third pads and the second terminal, thereby establishing the transmission path of at least one of a power signal and a ground signal between the first package substrate and the chip package.

According to an aspect of another exemplary embodiment, there is provided a semiconductor package including: a first semiconductor chip mounted on a first package substrate, a chip package stacked on the first semiconductor chip, the chip package including at least one second semiconductor chip mounted on a second package substrate, and a plurality of connection terminals provided between the first semiconductor chip and the second package substrate to connect the chip package directly and electrically to the first semiconductor chip. The second package substrate may include a plurality of connection pads connected to the connection terminals and a plurality of test pads connected to the connection pads but electrically spaced apart from the connection terminals. The test pads may be arranged on a bottom surface of the second package substrate with a pitch different from a pitch of the connection pads.

In some exemplary embodiments, the connection pads may be arranged in a center region on the bottom surface of the second package substrate and configured to have a first size and a first pitch, and the test pads may be arranged in an edge region located around the center region on the bottom surface of the second package substrate and configured to have a second size and a second pitch. The second size may be larger than the first size and the second pitch may be larger than the first pitch.

In other exemplary embodiments, the second package substrate may further include a plurality of bonding pads electrically connected to the connection pads via the test pads, and the bonding pads may be arranged on a top surface of the second package substrate and electrically connected to the memory chip.

In still other exemplary embodiments, the first semiconductor chip may include a plurality of first bonding wires or a plurality of first through electrodes electrically connected to the connection terminals, and the at least one second semiconductor chip may include a plurality of second bonding wires or a plurality of second through electrodes electrically connected to the bonding pads.

In yet other exemplary embodiments, the first semiconductor chip may be mounted on the first package substrate in a face-down manner or a face-up manner. The face-down or face-up manner may refer to configuring an active surface of the first semiconductor chip to face the first package substrate or the second package substrate. The first through electrodes may be configured to establish a transmission path of at least one of a power signal and a ground signal between the first semiconductor chip mounted in the face-down manner and the chip package or configured to establish an electrical path between the first semiconductor chip mounted in the face-up manner and an external device.

According to an aspect of another exemplary embodiment, there is provided a chip package, including: a package substrate; and a semiconductor chip mounted on the package substrate, wherein the package substrate comprises a connection pad directly and electrically connectable to an external semiconductor chip, external to the chip package.

BRIEF DESCRIPTION OF THE DRAWINGS

Example embodiments will be more clearly understood from the following brief description taken in conjunction with the accompanying drawings. The accompanying drawings represent non-limiting, example embodiments as described herein, in which:

FIG. 2B is a sectional view of a portion of a second package substrate of a semiconductor package according to another example embodiment;

Figure 1A:
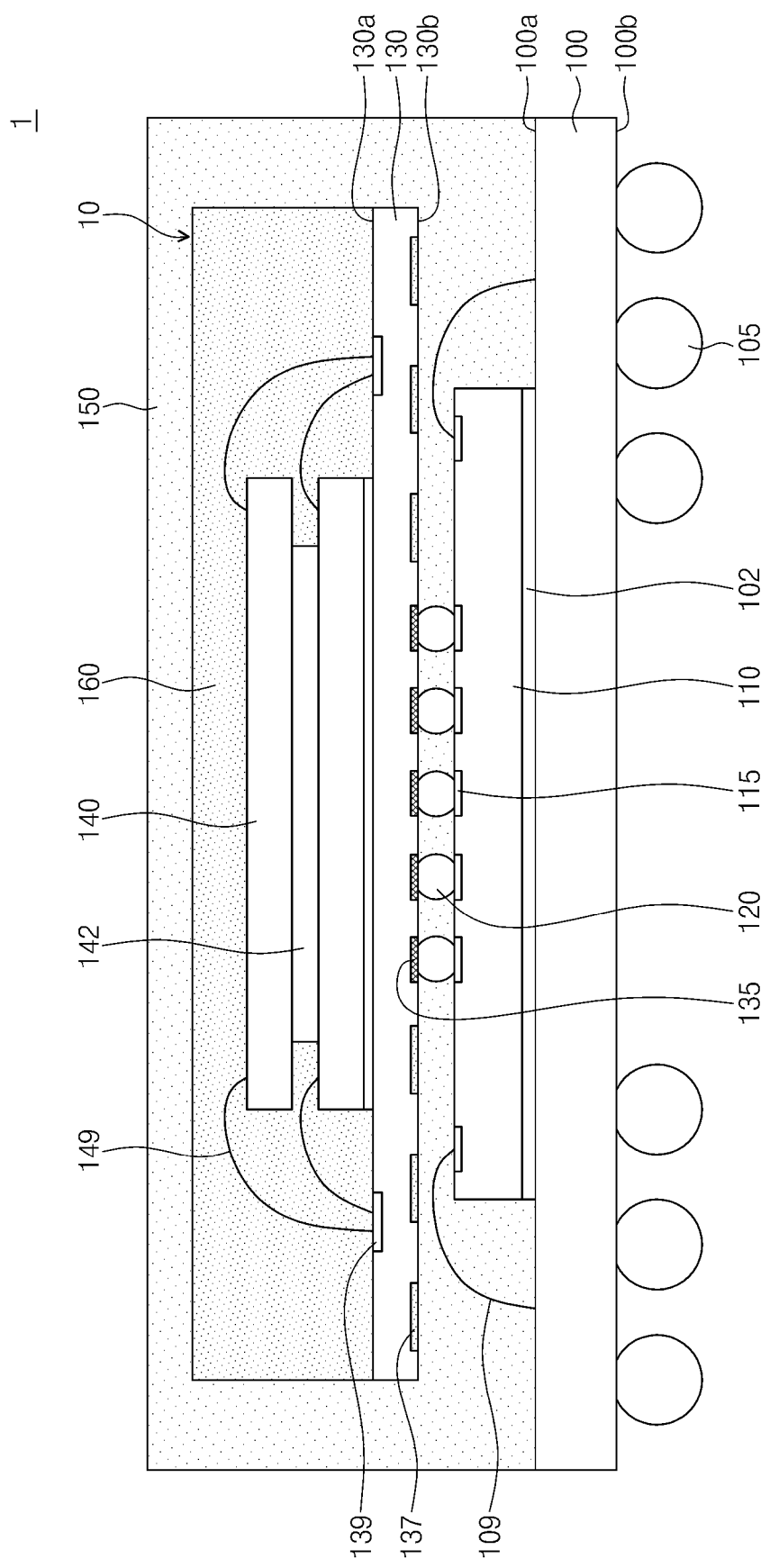
FIG. 1A is a sectional view of a semiconductor package according to an example embodiment.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Similarly, as used herein, expressions such as "at least one of," when preceding a list of elements, modify the entire list of elements and do not modify the individual elements of the list. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example Embodiments

FIG. 1A is a sectional view of a semiconductor package 1 according to an example embodiment.

Referring to FIG. 1A, a semiconductor package 1 may include a first semiconductor chip 110 mounted on a first package substrate 100 and a chip package 10 provided on the first semiconductor chip 110. The chip package 10 may be directly and electrically connected to the first semiconductor chip 110 via at least one connection terminal 120 such as a solder bump or a solder ball. The chip package 10 may include at least one second semiconductor chip 140 mounted on a second package substrate 130. The semiconductor package 1 may further include a first molding layer 150 encapsulating the chip package 10 and/or the chip package 10 may further include a second molding layer 160.

In one or more example embodiments, at least one of the first package substrate 100 and the second package substrates 130 may be an interposer or a printed circuit board. At least one of the first package substrate 100 and the second package substrate 130 may include a substrate made of at least one of silicon, silicone, glass, ceramic, resin, etc. The first semiconductor chip 110 may be a logic chip such as a processor chip or a controller chip, and the second semiconductor chip 140 may be a memory chip such as a DRAM chip or a FLASH memory chip. In the present description, the first semiconductor chip 110 is described as a logic chip and the second semiconductor chip 140 is described as a memory chip, for convenience of description. However, it is understood that one or more other example embodiments are not limited thereto. For instance, in another example embodiment, the first semiconductor chip 110 may be a memory chip and the second semiconductor chip 140 a logic chip.

The logic chip 110 (i.e., first semiconductor chip 110) may be connected to the first package substrate 100 in a wire bonding manner. For instance, the logic chip 110 may be attached to a top surface 100a of the first package substrate 100 using a first adhesive layer 102 and may be electrically connected to the first package substrate 100 via at least one bonding wire 109. The logic chip 110 may include a plurality of chip pads 115 connected to the bonding wires 109 and the connection terminals 120. At least one external terminal 105 may be attached on a bottom surface 100b of the first package substrate 100 to electrically connect the semiconductor package 1 with an external device. In one or more example embodiments, the external terminal 105 may include at least one of a solder bump and a solder ball.

The chip package 10 may include a wire bonding structure. For example, the memory chips 140 (i.e., second semiconductor chips 140) may be adhered to each other using a second adhesive layer 142 and mounted on the second package substrate 130. In addition, the memory chips 140 may be electrically connected to the second package substrate 130 via at least one bonding wire 149. The first and second adhesive layers 102 and 142 may be an insulating layer or tape. The insulating layer or tape may comprise at least one of epoxy, silicon, silicone, etc. The chip package 10 may be configured to have an inner stack memory package structure in which a plurality of the memory chips 140 are stacked on the second package substrate 130 provided in the semiconductor package 1. In one or more example embodiments, the semiconductor package 1 may be configured to have a package-in-package (PiP) or system-in-package (SiP) structure.

The second package substrate 130 may include a plurality of first pads 135, which may be coupled to the connection terminals 120 and serve as current pathways for transmitting electrical signals among the memory chips 140 and the logic chip 110. The second package substrate 130 may further include a plurality of second pads 137 provided for testing whether the memory chips 140 can be normally operated. In one or more example embodiments, a testing to test whether the chip package 10 can be normally operated may be performed before manufacturing the semiconductor package 1, and thus, the semiconductor package 1 may be manufactured with an increased yield. Furthermore, the second package substrate 130 may serve as an intermediate element for realizing electric connections between the logic chip 110 and the memory chips 140. Even in the case that the position and/or the number of the chip pads 115 of the logic chip 110 correspond to the position and/or the number of chip pads (not shown) of the memory chips 140, the logic chip 110 and the memory chips 140 may be electrically connected with each other via the second package substrate 130. The chip package 10 may be directly connected to the logic chip 110 via the connection terminals 120, and this direct connection may make it possible to easily realize a fast operation of the semiconductor package 1.

Hereinafter, for convenience of description, the first pads 135 may refer to connection pads and the second pads 137 may refer to test pads.

Figure 1B:
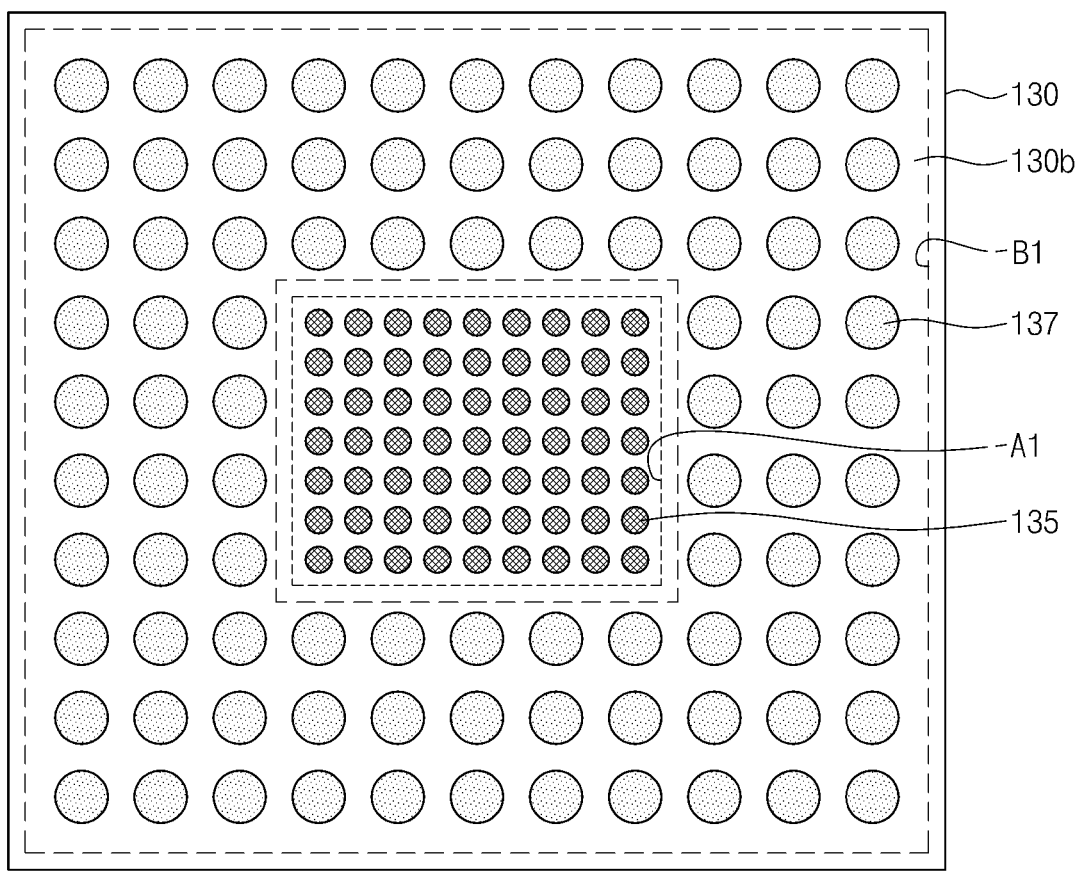
FIG. 1B is a bottom plan view of a second package substrate of a semiconductor package according to an example embodiment.
Figure 1C:
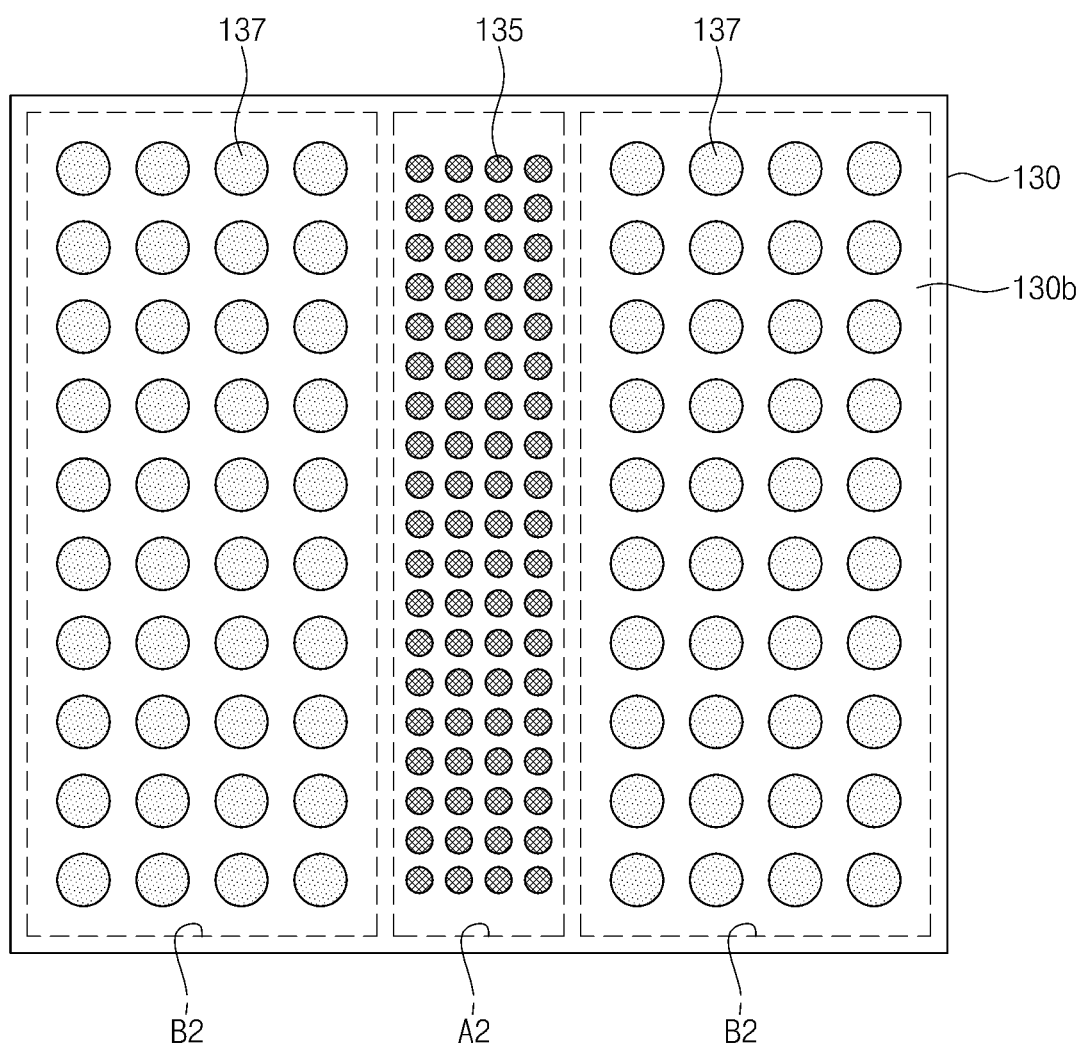
FIGS. 1C and 1D are plan views of modifications of the semiconductor package of FIG. 1B.
Figure 1D:
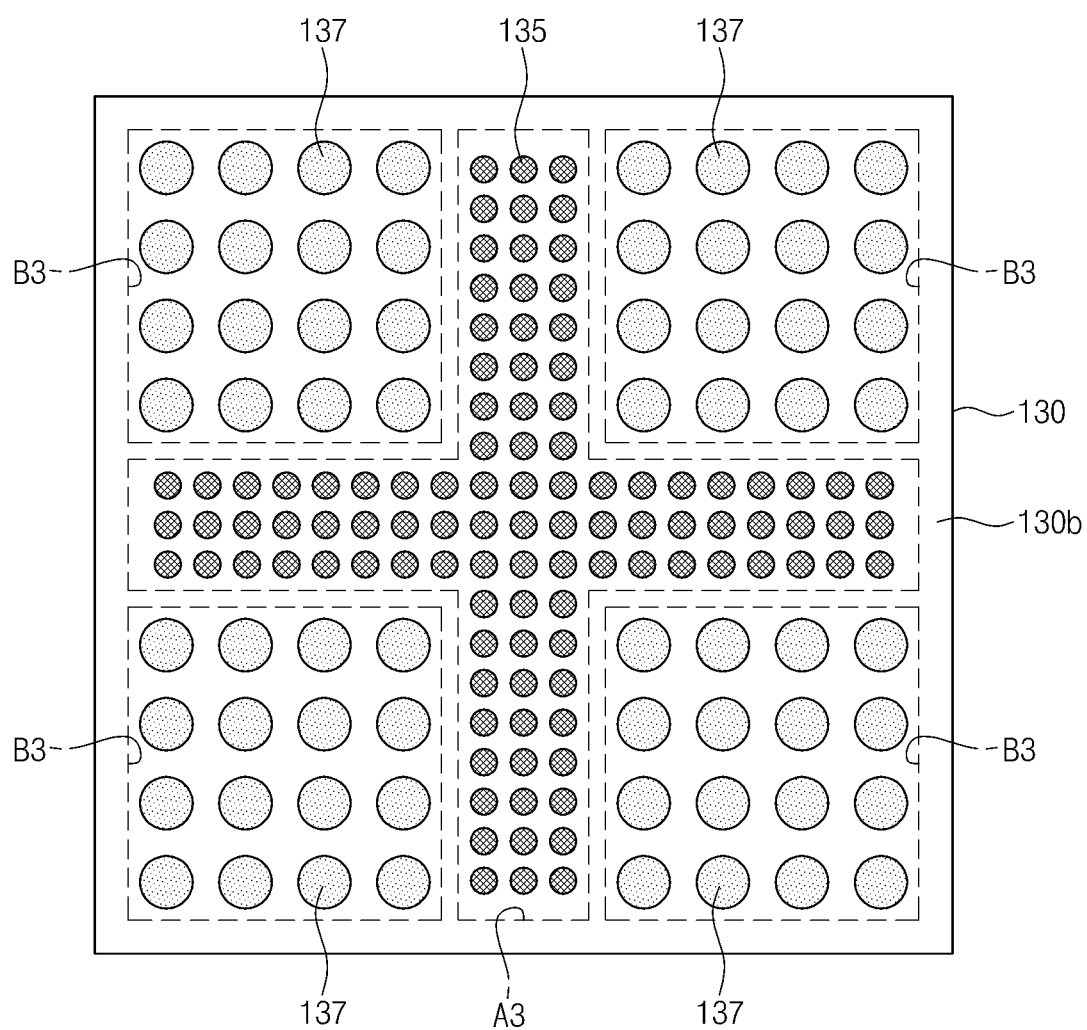
Figure 1E:
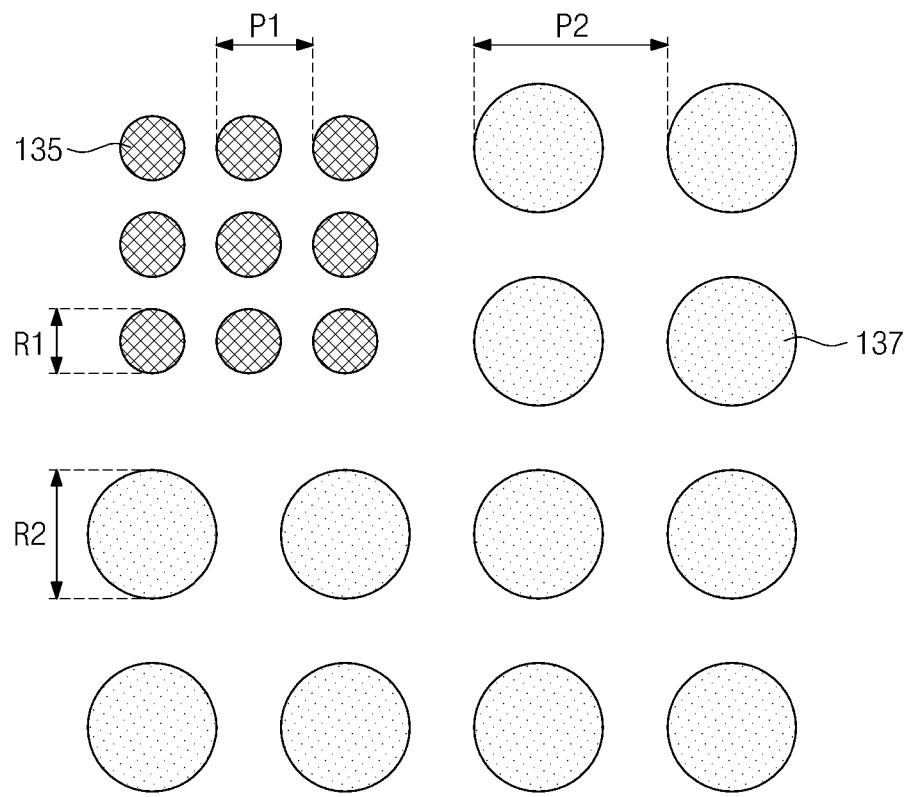
FIG. 1E is a plan view of a portion of the semiconductor package of FIG. 1B.

FIG. 1B is a bottom plan view of a second package substrate 130 of a semiconductor package 1 according to an example embodiment. FIGS. 1C and 1D are plan views of modifications of the semiconductor package 1 of FIG. 1B. FIG. 1E is a plan view of a portion of the semiconductor package 1 of FIG. 1B.

Referring to FIG. 1B in conjunction with FIG. 1A, the second package substrate 130 may include a top surface 130*a* and a bottom surface 130*b* opposite the top surface 130*a*. The memory chip 140 (i.e., second semiconductor chip 140) may be on the top surface 130*a* of the second package substrate 130. The connection pads 135 and the test pads 137 may be disposed on the bottom surface 130*b* of the second package substrate 130. Bonding pads 139 may be disposed on the top surface 130*a* of the second package substrate 130, and the bonding wires 149 may be connected to the bonding pads 139. The number and positions of the bonding pads 139 may vary in one or more example embodiments depending on the number and positions of the bonding wires 149.

At least one of the connection pads 135 and the test pads 137 may be uniformly or locally arranged on the bottom surface 130*b*. For instance, in the case that the connection pads 135 are arranged on a portion of the bottom surface 130*b* of the second package substrate 130, the test pads 137 may be arranged on a region which is not occupied by the connection pads 135. In one or more example embodiments, the chip pads 115 may be arranged on a center region of the logic chip 110 (i.e., first semiconductor chip 110), and the connection pads 135 may be arranged on a center region A1 of the bottom surface 130*b* of the second package substrate 130 corresponding to the center region of the logic chip 110. From a vertical sectional view, the connection pads 135 and the chip pads 115 may be substantially aligned with each other. In one or more other example embodiments, the connection pads 135 may include redistributed lines vertically aligned with the chip pads 115. The test pads 137 may be arranged on an edge region B1 surrounding the center region A1 of the bottom surface 130*b*.

The number of the test pads 137 may be the same as or different from the number of the connection pads 135. The test pads 137 and the connection pads 135 may be configured to have or substantially have a one-to-one correspondence therebetween, and in this case, the memory chip 140 may be tested in all its aspects. In one or more example embodiments, at least one of the test pads 137 may not be electrically connected to the logic chip 110, and may be used to test the memory chip 140. In this case, the number of the test pads 137 may be greater than the number of the connection pads 135. In one or more other example embodiments, as will be described with reference to FIG. 2C, the test pads 137 and the connection pads 135 may be in a one-to-many or many-to-one correspondence.

Referring to FIG. 1C, the connection pads 135 may be arranged on a middle region A2 crossing a center region of the bottom surface 130*b* of the second package substrate 130. The test pads 137 may be arranged on side regions B2 at opposite sides of the middle region A2. Alternatively, as shown in FIG. 1D, the connection pads 135 may be arranged on a cross-shaped region A3 extending from the center region of the bottom surface 130*b* of the second package substrate 130 to four side edges of the bottom surface 130*b*. The test pads 137 may be arranged on corner regions B3 at corners of the bottom surface 130*b* of the second package substrate 130.

In one or more example embodiments, the arrangement of the connection pads 135 may be deeply dependent on that of the chip pads 115 of the logic chip 110. In contrast, the test pads 137 may be freely arranged irrespective of the connection pads 135 and/or the chip pads 115.

Referring to FIG. 1E, the connection pads 135 may be the same as or similar to each other in terms of shape and/or size, and the test pads 137 may be the same as or similar to each other in terms of shape and/or size. In one or more example embodiments, the test pads 137 may be different from the connection pads 135 in terms of size and/or pitch. The connection pads 135 may have a small pitch compared with the test pads 137. Size and pitch of the test pads 137 may be irrelevant to an integration density or miniaturization degree of the logic chip 110 and/or the memory chip 140 and to size and pitch of the connection pads 135, and therefore, the test pads 137 may be formed to have relatively large size and pitch, for instance, as compared to the connection pads 135.

In one or more example embodiments, the connection pads 135 may be arranged in a first pitch P1 and each of the connection pads 135 may be shaped to have a circular section having a first radius R1. Each of the test pads 137 may be shaped to have a circular section having a second radius R2 greater than the first radius R1, and the test pads 137 may be arranged in a second pitch P2 greater than the first pitch P1. For instance, the first pitch P1 may be 50 μm or less, and the second pitch P2 may be 200 μm or more. According to one or more example embodiments, the test pad 137 may be formed to have a relatively large size and pitch as compared to the connection pads 135, thus making it possible to easily, interchangeably and adaptively test the device.

In the case that the size and the pitch of the test pad 137 are larger than those of the connection pads 135, as shown in FIG. 1B, the center region A1 may be formed to have a smaller occupying area than the edge region B1. Similarly, as shown in FIG. 1C, the middle region A2 may be formed to have a smaller occupying area than the side regions B2, and as shown in FIG. 1D, the cross-shaped region A3 may be formed to have a smaller occupying area than the corner regions B3.

Figure 1F:
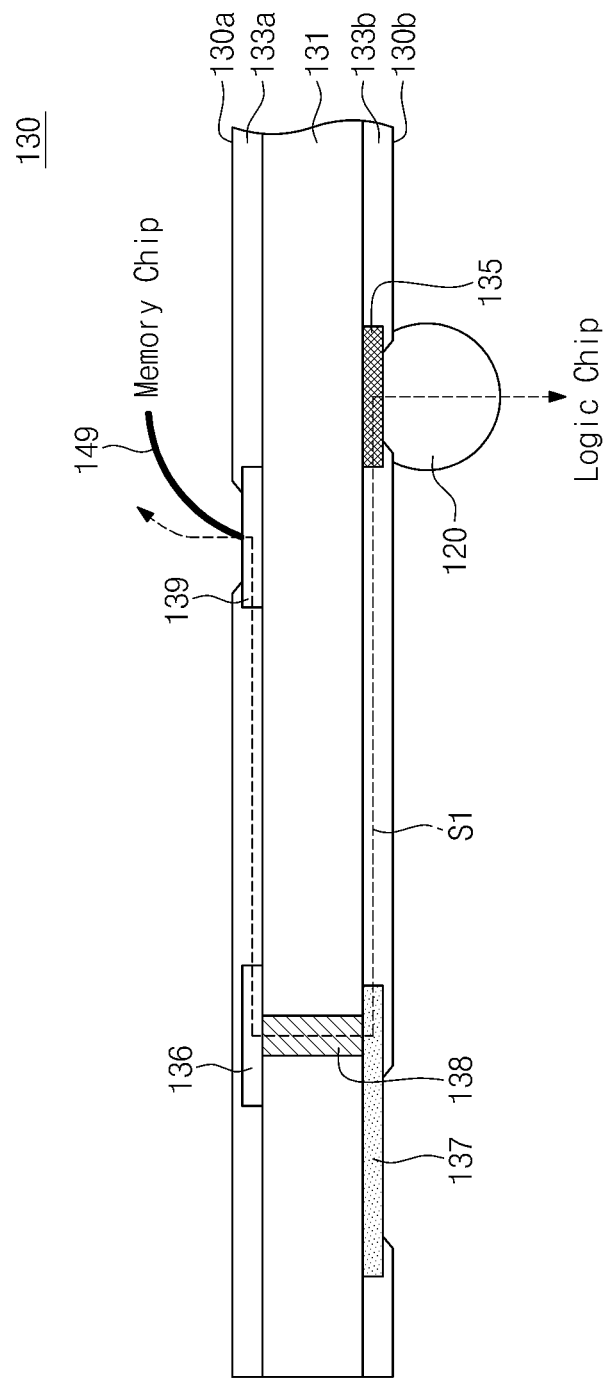
FIG. 1F is a sectional view of a second package substrate of a semiconductor package according to an example embodiment.
Figure 1G:
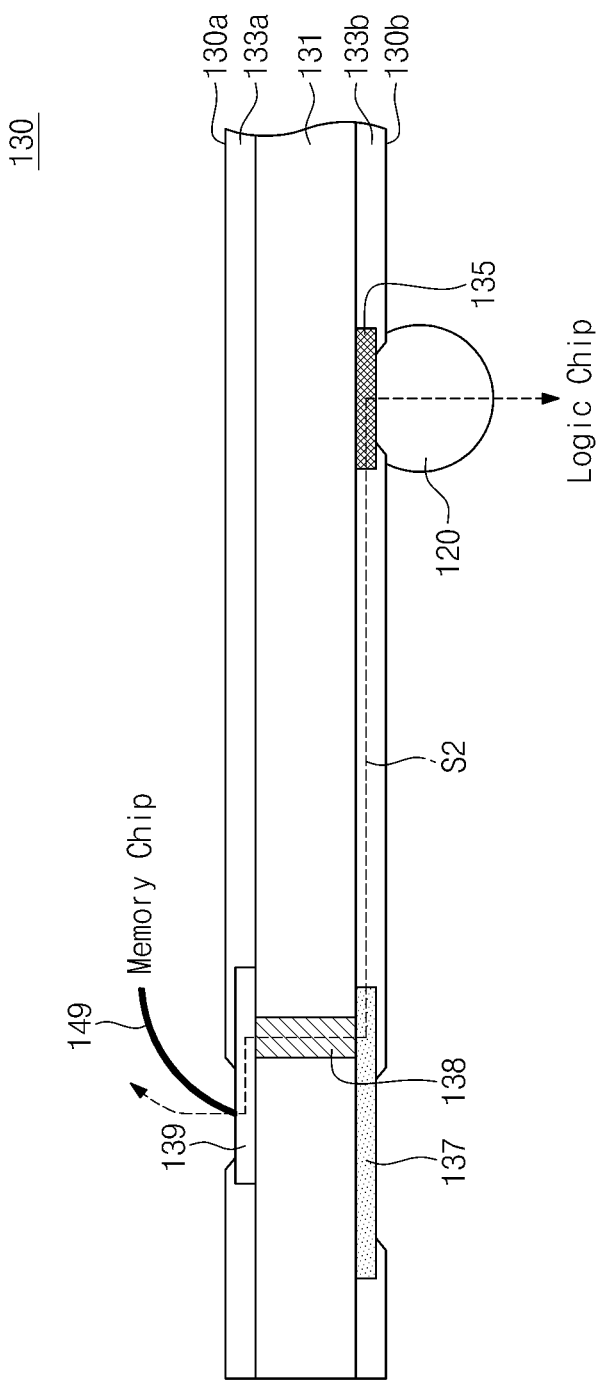
FIG. 1G is a sectional view of a modification of the semiconductor package of FIG. 1F.

FIG. 1F is a sectional view of a second package substrate 130 of a semiconductor package 1 according to an example embodiment. FIG. 1G is a sectional view of a modification of the semiconductor package 1 of FIG. 1F.

Referring to FIG. 1F in conjunction with FIG. 1A, the second package substrate 130 may include a core 131, an upper insulating layer 133*a* covering a top surface of the core 131, and a lower insulating layer 133*b* covering a bottom surfaces of the core 131. The core 131 may include at least one of silicon, silicone, glass, ceramic, and resin. The upper and lower insulating layers 133*a* and 133*b* may include at least one of insulating materials such as oxide, nitride, and/or polymer.

Each of the bonding pads 139 may be partially encapsulated by the upper insulating layer 133*a*. In other words, a portion of the bonding pad 139 may be exposed by the upper insulating layer 133*a* and the bonding wires 149 may be connected to the exposed surfaces of the bonding pads 139, respectively. Each of the test pads 137 may be partially encapsulated by the lower insulating layer 133*b*. In other words, a portion of the test pad 137 may be exposed by the lower insulating layer 133*b*, and a test device, e.g., probe tips, may be electrically and/or mechanically connected to the exposed surfaces of the test pads 137. Each of the connection pads 135 may be partially encapsulated by the lower insulating layer 133*b*. In other words, a portion of the connection pad 135 may be exposed by the lower insulating layer 133*b*, and the connection terminals 120 may be connected to the exposed surfaces of the connection pads 135, respectively. That is, the bonding pads 139 may be exposed through the top surface 130*a* of the second package substrate 130, and the connection pads 135 and the test pads 137 may be exposed through the bottom surface 130*b* of the second package substrate 130.

The test pads 137 and the connection pads 135 may be electrically connected to each other. The bonding pads 139 and the test pads 137 may be electrically connected to each other. For instance, on the top surface of the core 131, there may be auxiliary pads 136, which may be electrically connected to the bonding pads 139 and vertically or substantially vertically aligned with the test pads 137. In one or more example embodiments, the auxiliary pads 136 may be fully covered by the upper insulating layer 133a. The auxiliary pads 136 and the test pads 137 may be connected to each other using vias 138 penetrating the core 131. One connection pad 135, one test pad 137, one via 138, one auxiliary pad 136 and one bonding pad 139 may constitute a first pathway S1 serving as a current path for transmitting an electric signal. Electric signals, such as a data signal, a power signal, and/or a ground signal, may be transmitted from the logic chip 110 (FIG. 1A) to the memory chip 140 (FIG. 1A) or vice versa via the first pathway S1. An electric signal transmitted to the bonding pads 139 may be delivered to at least one of the memory chips 140 via the bonding wires 149. An electric signal transmitted to the connection pads 135 may be delivered to the logic chip 110 via the connection terminals 120.

Referring to FIG. 1G, according to another example embodiment, the test pads 137 may be substantially vertically aligned with the bonding pads 139. The test pads 137 and the bonding pads 139 may be connected to each other using the vias 138 penetrating the core 131. One connection pad 135, one test pad 137, one via 138 and one bonding pad 139 may constitute a second pathway S2 serving as a current path for transmitting an electric signal, which may be transmitted from the logic chip 110 (FIG. 1A) to the memory chip 140 (FIG. 1A) or vice versa.

Other Example Embodiments

Figure 2A:
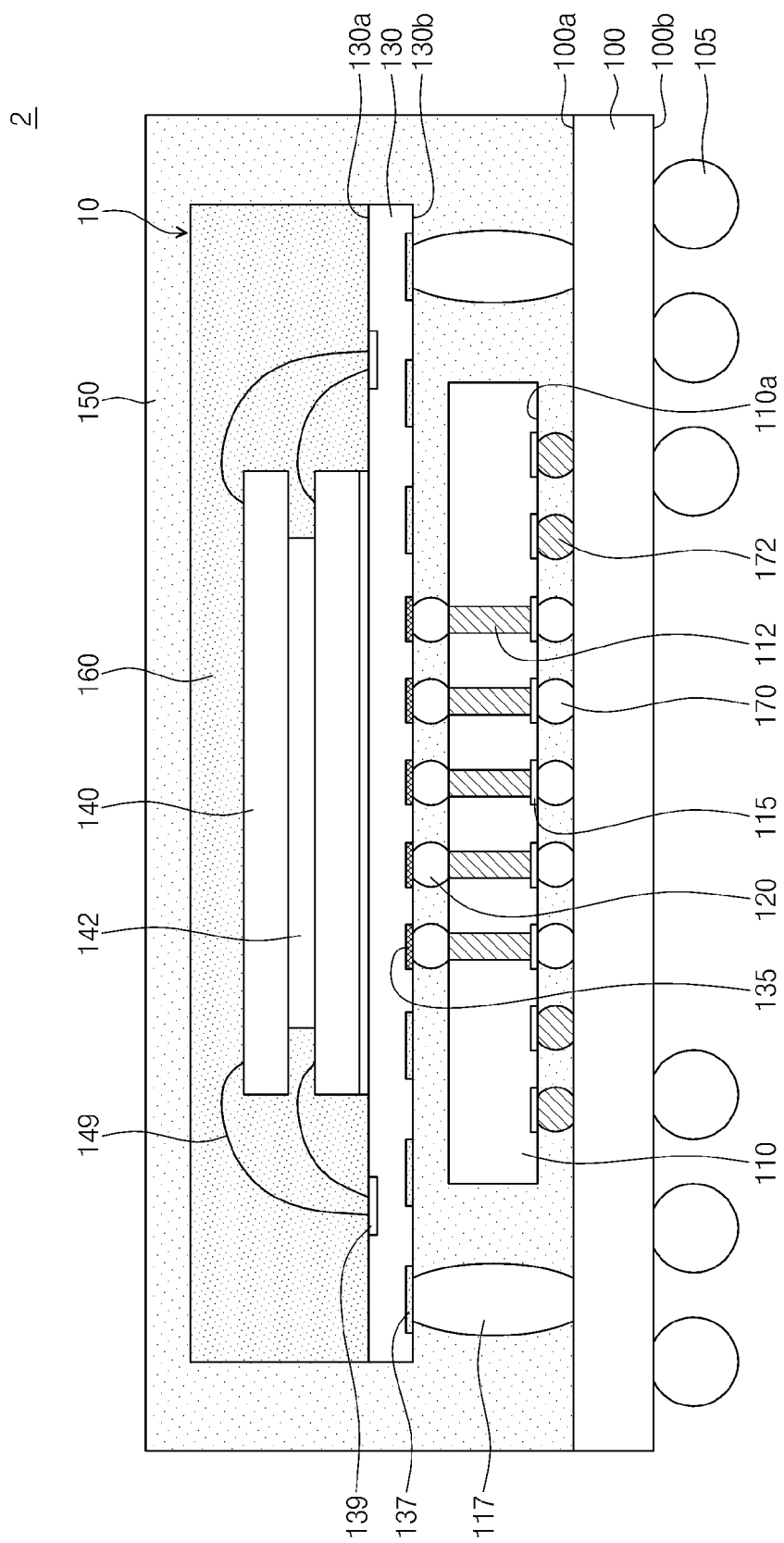
FIG. 2A is a sectional view of a semiconductor package according to another example embodiment.
Figure 2C:
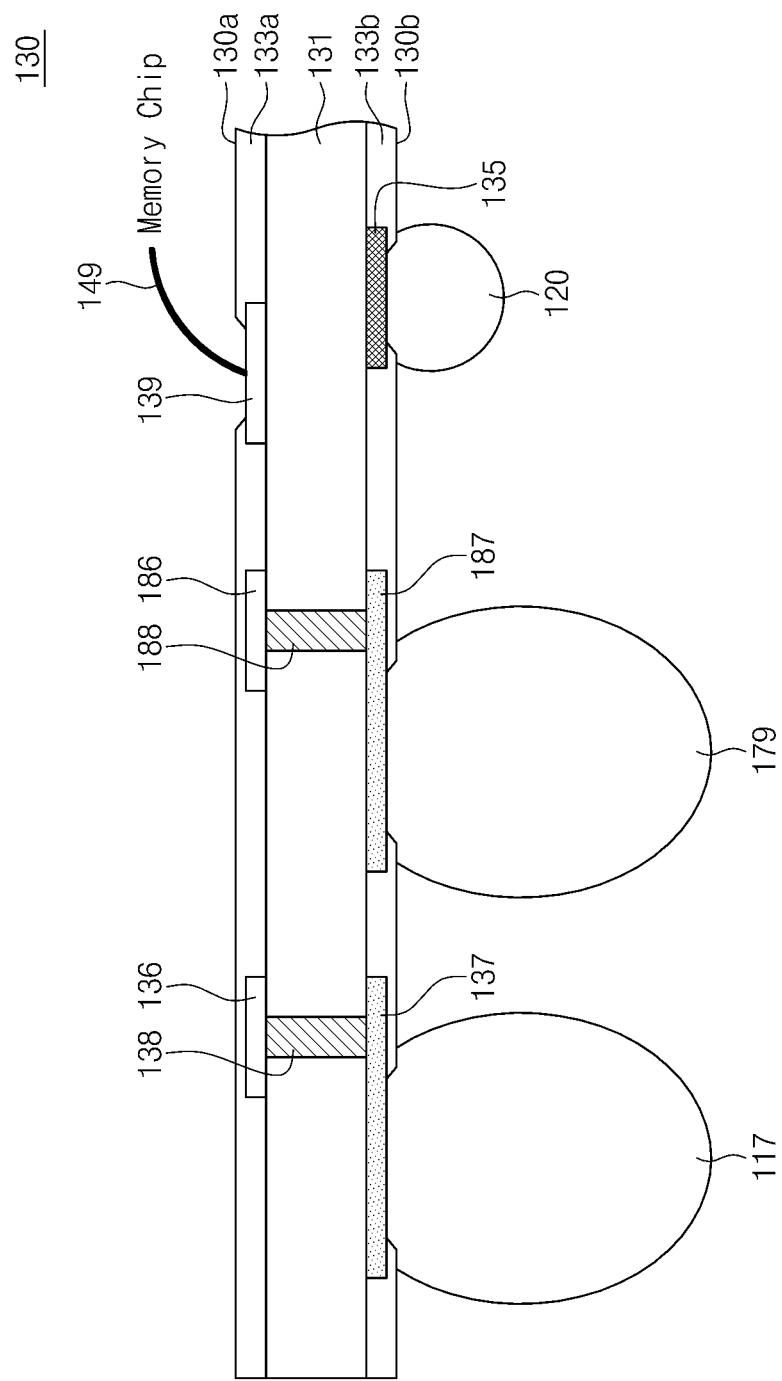
FIG. 2C is a sectional view of a modification of the semiconductor package of FIG. 2B.

FIG. 2A is a sectional view of a semiconductor package 2 according to another example embodiment. FIG. 2B is a sectional view of a portion of a second package substrate 130 of a semiconductor package 2 according to another example embodiment. FIG. 2C is a sectional view of a modification of the semiconductor package 2 of FIG. 2B. For convenience of description, overlapping descriptions of elements previously described with reference to FIGS. 1A through 1G may be omitted.

Referring to FIG. 2A, a semiconductor package 2 may include a first semiconductor chip 110 (e.g., a logic chip 110), including at least one through electrode 112, mounted on a first package substrate 100 and a chip package 10 including a bonding wire structure that is electrically connected to the logic chip 110 via connection terminals 120. The logic chip 110 may be bonded to the first package substrate 100 in a flip chip bonding manner. For instance, the logic chip 110 may be mounted on the top surface 100a of the first package substrate 100 in such a way that an active surface 110a provided with chip pads 115 is faced down. The logic chip 110 and the first package substrate 100 may be electrically connected with each other using at least one internal signal terminal 170. The internal signal terminals 170 may be connected to the chip pads 115, respectively.

Similar to the example embodiments described with reference to FIGS. 1A through 1E, a second package substrate 130 of the chip package 10 may include connection pads 135 having a relatively small size and/or a relatively small pitch and test pads 137 having a relatively large size and/or a relatively large pitch as compared to the connection pads 135. The connection pads 135 and the test pads 137 may be disposed on a bottom surface 130b of the second package substrate 130 and connected to the connection terminals 120.

The logic chip 110 may further include at least one external signal terminal 172. The external signal terminal 172 may be connected to the chip pad 115 and electrically connect the logic chip 110 to an external device (not shown).

The through electrodes 112 may be provided to realize a functional connection between the logic chip 110 and the chip package 10. For instance, the through electrodes 112 may electrically connect the internal signal terminals 170 with the connection terminals 120 and thus can be used as a pathway for transmitting electric signals, such as a data signal, a power signal, and/or a ground signal, between the logic chip 110 and the chip package 10. The electric signals may be transmitted from a second semiconductor chip 140 (e.g., a memory chip 140) to the logic chip 110 or vice versa, via the first pathway S1 shown in FIG. 1F or the second pathway S2 shown in FIG. 1G.

In one or more other example embodiments, the semiconductor package 2 may further include at least one power or ground terminal 117 transmitting the power signal or the ground signal from the first package substrate 100 to the chip package 10 or vice versa.

Referring to FIG. 2B in conjunction with FIG. 2A, for instance, at least one of the power or ground terminals 117 may be connected to at least one of the test pads 137 disposed around the logic chip 110. The power or ground signal may be transmitted via an upper pathway P1 connecting one of the test pads 137 to one of the bonding pads 139 along the top surface 130a of the second package substrate 130. The data signal may be transmitted from the logic chip 110 to at least one of the memory chips 140 or vice versa via other test pads 137 electrically separated from the power or ground terminal 117.

The second package substrate 130 may further include at least one electric connection intermediate 180 provided to transmit the power or ground signal. Each of the electric connection intermediate 180 may include an upper pad 186 on the top surface of the core 131, a lower pad 187 on the bottom surface of the core 131, and a via 188 penetrating the core 131 to connect the upper and lower pads 186 and 187 with each other. The upper pad 186 may be fully encapsulated by an upper insulating layer 133a and the lower pad 187 may be fully encapsulated by a lower insulating layer 133b. The upper pad 186 may be electrically connected to the auxiliary pad 136 and the bonding pad 139, and the lower pad 187 may be electrically connected to the test pad 137 and the connection pad 135.

The power or ground signal may be transmitted from the first package substrate 100 to at least one of the memory chips 140 or vice versa via a lower pathway P2, connecting one of the test pads 137 with one of the bonding pads 139 along the bottom surface 130a of the second package substrate 130, as well as via the upper pathway P1.

Referring to FIG. 2C, the lower pad 187 may be partially covered by the lower insulating layer 133b and be exposed through the bottom surface 130b of the second package substrate 130. In addition, a power or ground terminal 179 may be connected to the lower pad 187. In one or more example embodiments, the power or ground signal may be transmitted via at least two power or ground terminals 117 and 179. As a result, the power or ground signal may be effectively transmitted between the first package substrate 100 and the chip package 10.

In one or more other example embodiments, the number of the test pads 137 may be greater than the number of the connection pads 135. For instance, two or more of the test pads 137 may be electrically connected to one of the connection pads 135 and/or one of the bonding pads 139. In one or more further example embodiments, the number of the test pads 137 may be less than that of the connection pads 135. For instance, one of the test pads 137 may be electrically connected to two or more of the connection pads 135 and/or two or more of the bonding pads 139.

Figure 2D:
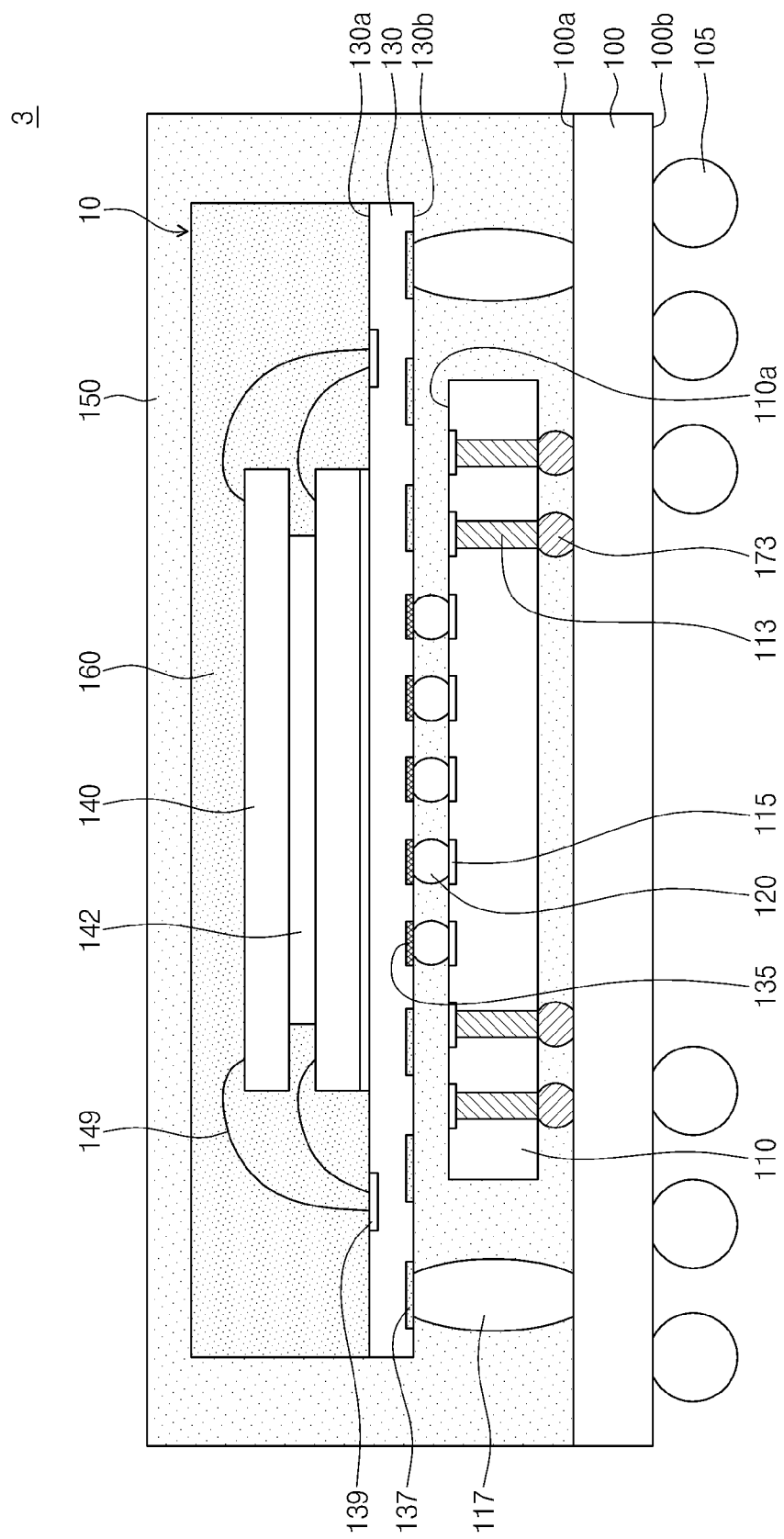
FIG. 2D is a sectional view of a modification of the semiconductor package of FIG. 2A.

FIG. 2D is a sectional view of a modification of the semiconductor package 2 of FIG. 2A.

Referring to FIG. 2D, a semiconductor package 3 may include the logic chip 110 (i.e., the first semiconductor chip 110) including at least one through electrode 113 mounted on the first package substrate 100 and the chip package 10 including the bonding wire structure that is electrically connected to the logic chip 110 via the connection terminals 120. The logic chip 110 may be mounted on the top surface 100a of the first package substrate 100 in such a way that the active surface 110a provided with the chip pads 115 is faced up. The second package substrate 130 of the chip package 10 may be configured in the same manner as the example embodiments described with reference to FIGS. 1A through 1E.

The through electrodes 113 may be provided to realize an external connection between the logic chip 110 and an external device (not shown). In some embodiments, the through electrodes 113 may be connected to the chip pads 115 which are not connected to the connection terminals 120, and the logic chip 110 may be electrically connected to the external device (not shown) using these through electrodes 113.

The logic chip 110 and the chip package 10 may communicate electric signals, such as a data signal, a power signal, and/or a ground signal, to each other via the connection terminals 120. For instance, the electric signals may be transmitted from the logic chip 110 to the memory chip 140 of the chip package 10 or vice versa, via the first pathway 51 shown in FIG. 1F or the second pathway S2 shown in FIG. 1G.

In one or more other example embodiments, the semiconductor package 3 may further include at least one power or ground terminal 117 or at least one electric connection intermediate 180, which may be configured to transmit the power signal or the ground signal from the first package substrate 100 to the chip package 10 or vice versa, as shown in FIG. 2B. In this case, the data signal may be transmitted from the first package substrate 100 to the chip package 10 or vice versa via some of the connection terminals 120 to which the power or ground terminals 117 are not connected. In one or more other example embodiments, as shown in FIG. 2C, the semiconductor package 3 may further include additional power or ground terminals 179, in addition to the power or ground terminals 117.

Modified Example Embodiments

FIGS. 3A through 3F are sectional views of semiconductor packages 4, 5, 6, 7, 8, and 9 according to modified example embodiments. For convenience of description, overlapping descriptions of elements previously described with reference to FIGS. 1A through 1G and FIGS. 2A through 2D may be omitted.

Figure 3A:
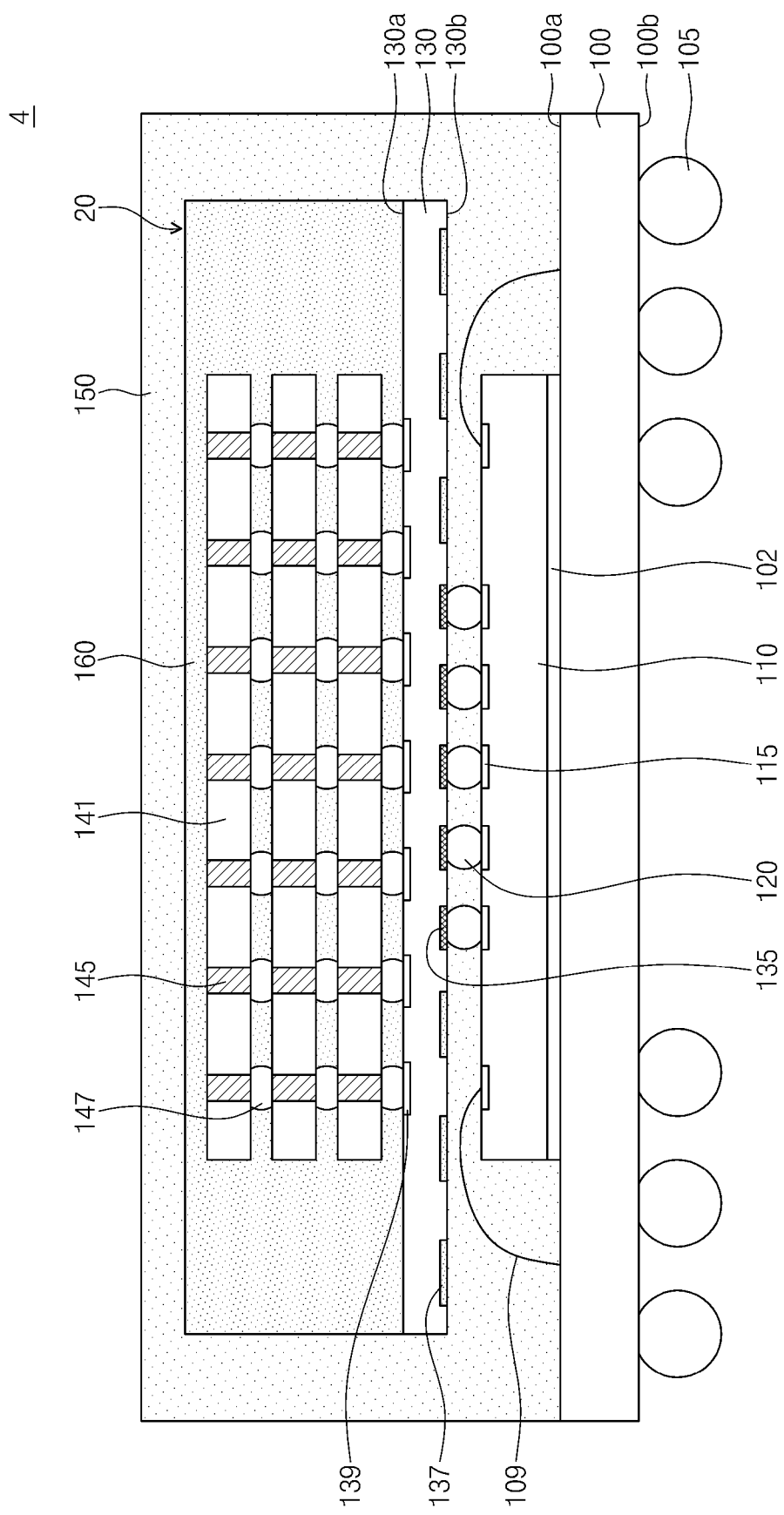
FIGS. 3A through 3F are sectional views of semiconductor packages according to example embodiments.

Referring to FIG. 3A, a semiconductor package 4 may include a first semiconductor chip 110 (e.g., a logic chip 110) bonded to a first package substrate 100 in a wire bonding manner and a chip package 20 electrically connected to the logic chip 110 via connection terminals 120. The chip package 20 may be configured to have an inner stack chip package structure. That is, a plurality of second semiconductor chips 141 (e.g., a plurality of memory chips 141), each of which includes at least one through electrode 145, may be stacked on a second package substrate 130 provided in the semiconductor package 4. The memory chips 141 may be electrically connected to each other via at least one bump 147 connected to the through electrode 145. At least one of the memory chips 141 may be mounted in the face-down or face-up manner. The second package substrate 130 of the chip package 20 may be configured in the same manner as the example embodiments described with reference to FIGS. 1A through 1G or FIGS. 2A through 2D. The logic chip 110 and the chip package 20 may communicate electric signals, such as a data signal, a power signal, and/or a ground signal, to each other via the connection terminals 120.

Figure 3B:
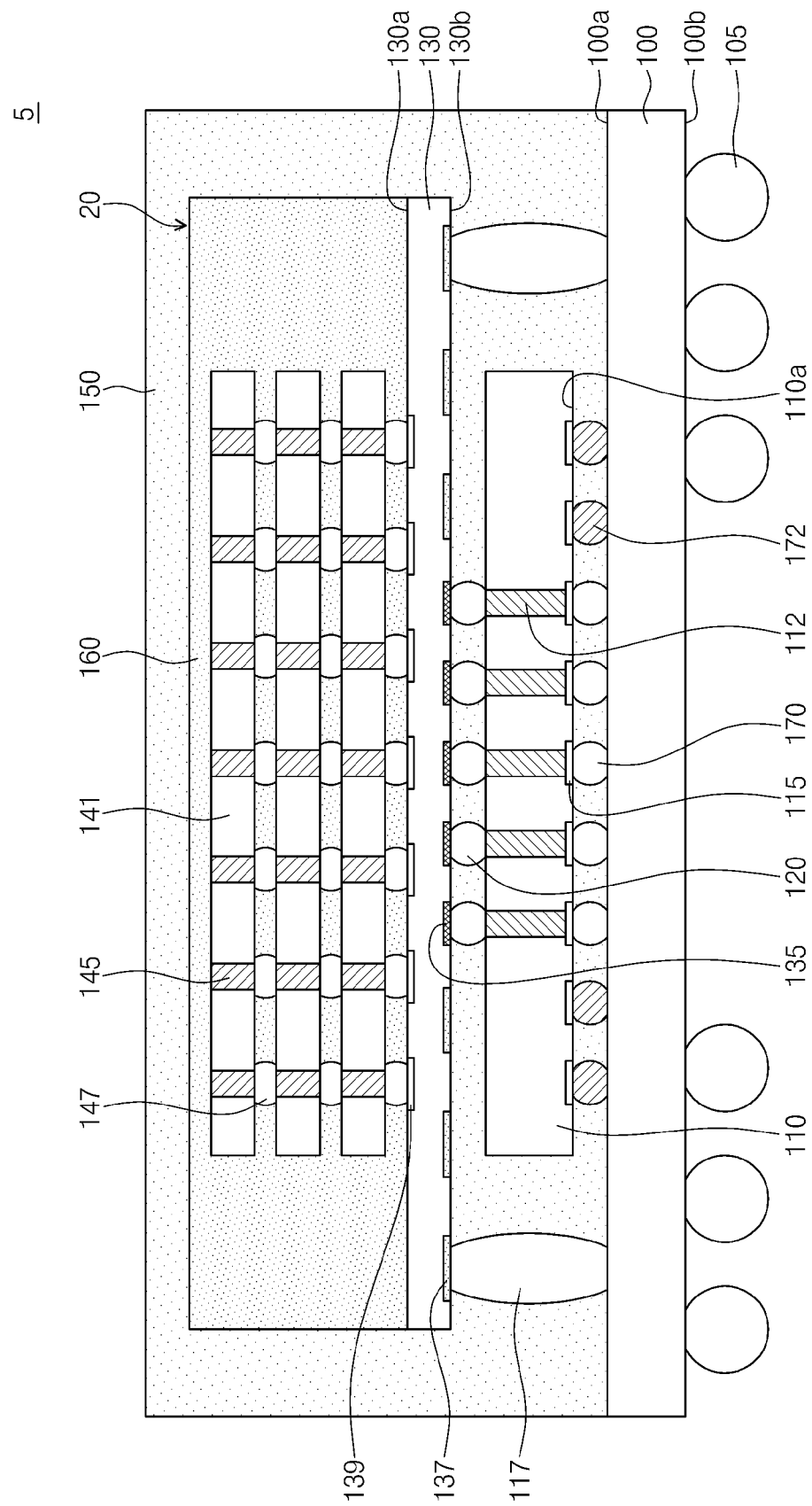

Referring to FIG. 3B, a semiconductor package 5 may include a first semiconductor chip 110 (e.g., a logic chip 110), which is mounted on a first package substrate 100 in a face-down manner and includes through electrodes 112, and a chip package 20 electrically connected to the logic chip 110 via connection terminals 120 connected to the through electrodes 112. The chip package 20 may be configured to have an inner stack chip package structure. That is, at least one second semiconductor chip 141 (e.g., a memory chip 141), each of which includes at least one through electrode 145, may be stacked on a second package substrate 130 provided in the semiconductor package 5. At least one internal signal pad 170 connected to the through electrode 112 and at least one external signal pad 172 electrically separated from the through electrode 112 may be provided between the first package substrate 100 and the logic chip 110. In addition, at least one power or ground terminal 117 may be provided to transmit a power or ground signal between the first package substrate 100 and the second package substrate 130 of the chip package 20. In one or more example embodiments, the logic chip 110 may be mounted on the top surface 100a of the first package substrate 100 in the face-up manner, as shown in FIG. 2D.

Figure 3C:
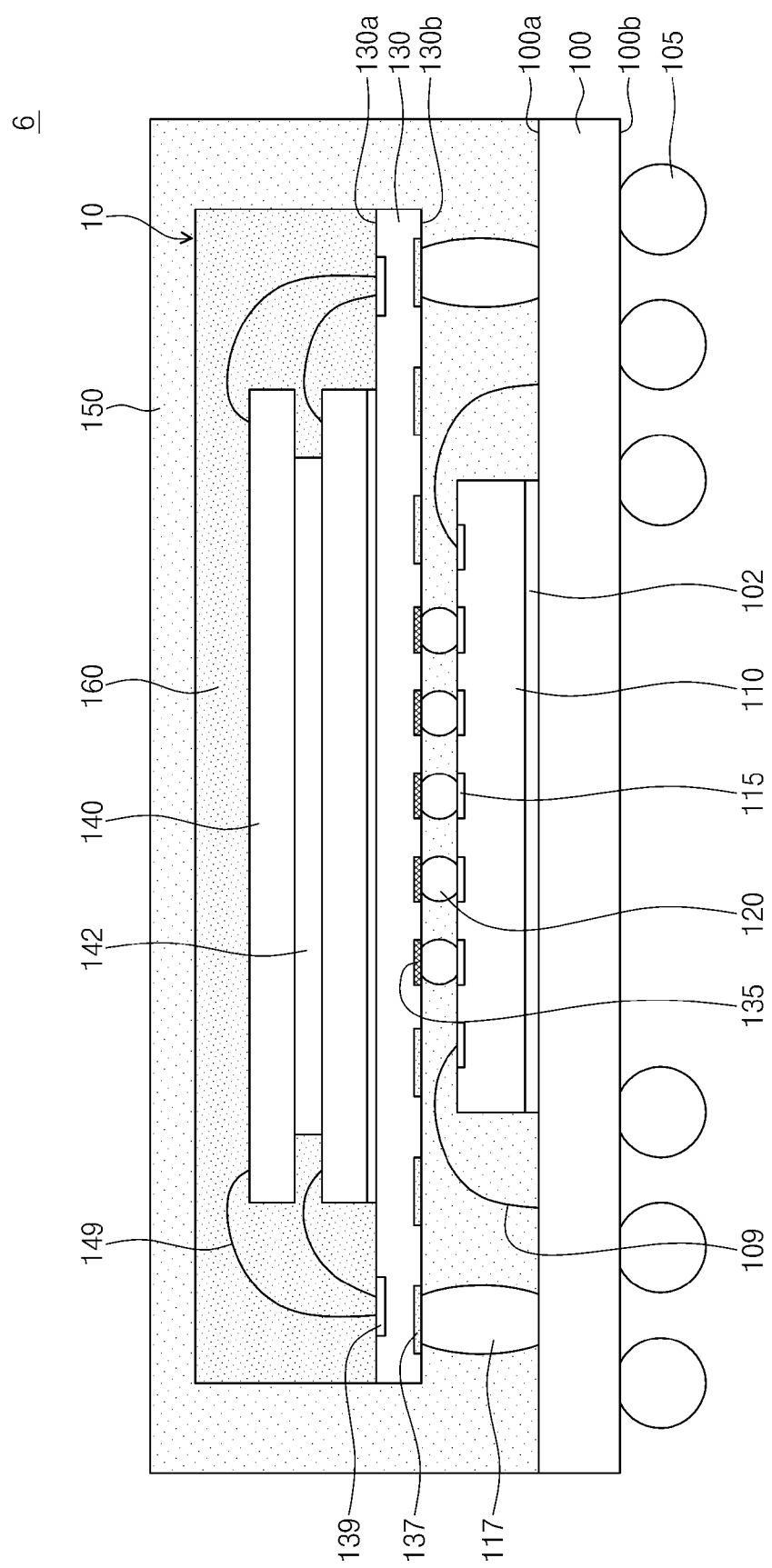

Referring to FIG. 3C, a semiconductor package 6 may include a first semiconductor chip 110 (e.g., a logic chip 110) bonded to a first package substrate 100 in a wire bonding manner and a chip package 10 electrically connected to the logic chip 110 via connection terminals 120. The chip package 10 may be configured to have an inner stack chip package structure. That is, second semiconductor chips 140 (e.g., memory chips 140) of the chip package 10 may be stacked on a second package substrate 130 and connected to the second package substrate 130 using bonding wires 149. In addition, at least one power or ground terminal 117 may be provided to transmit a power or ground signal between the first package substrate 100 and the second package substrate 130. Data signals may be transmitted via the connection terminals 120 and the power or ground signal may be transmitted via the power or ground terminals 117.

Figure 3D:
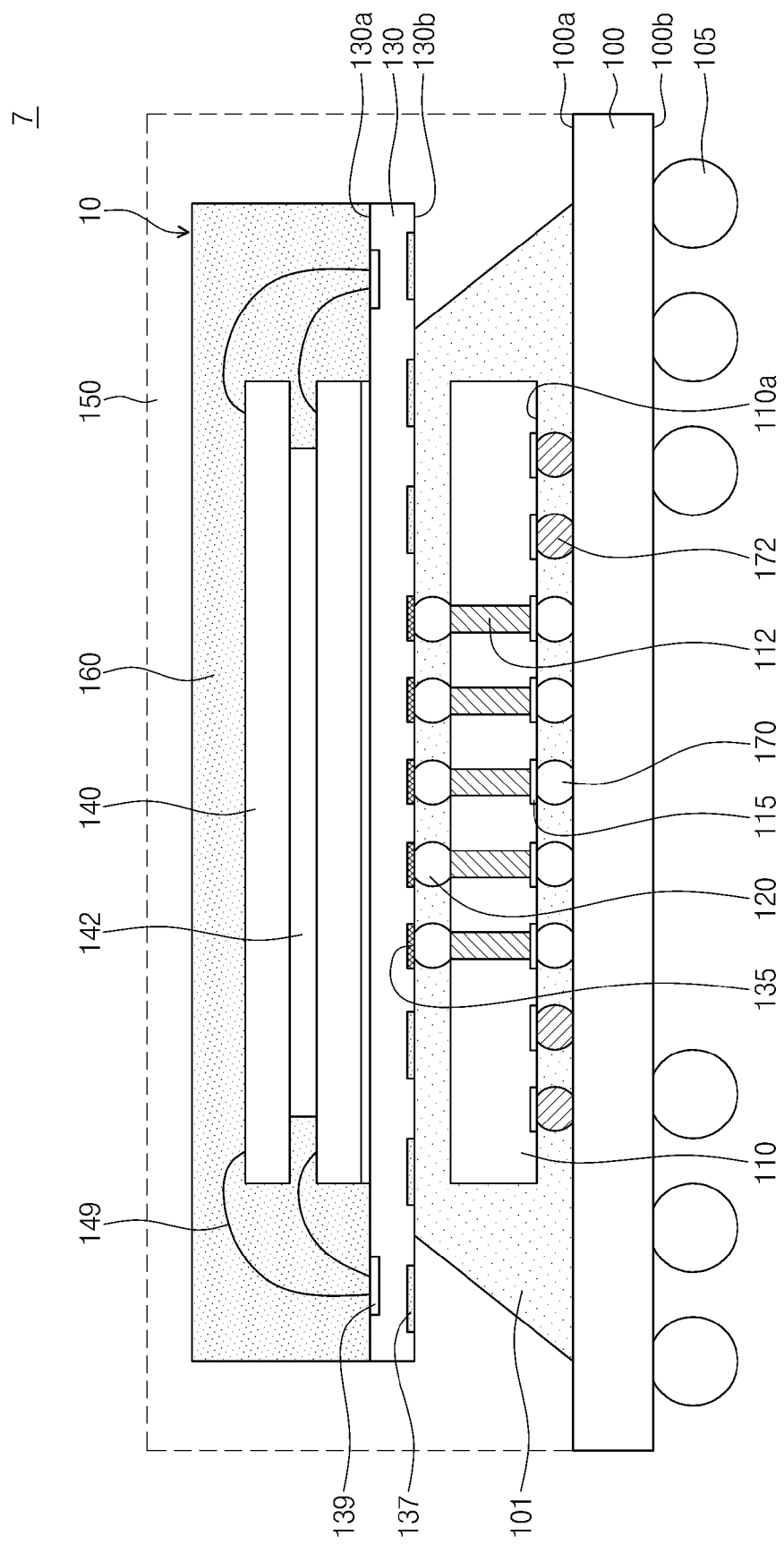

Referring to FIG. 3D, a semiconductor package 7 may include a first semiconductor chip 110 (e.g., a logic chip 110), which is bonded to a first package substrate 100 in a flip chip bonding manner and includes at least one through electrode 112, and a chip package 10 electrically connected to the logic chip 110 via connection terminals 120. An under-filling layer 101 may be provided between the first package substrate 110 and the chip package 10 to encapsulate the logic chip 110. In one or more example embodiments, the semiconductor package 7 may further include a first molding layer 150 encapsulating the chip package 10. In one or more other embodiments, the logic chip 110 may be mounted on the top surface 100a of the first package substrate 100 in the face-up manner, as shown in FIG. 2D.

Figure 3E:
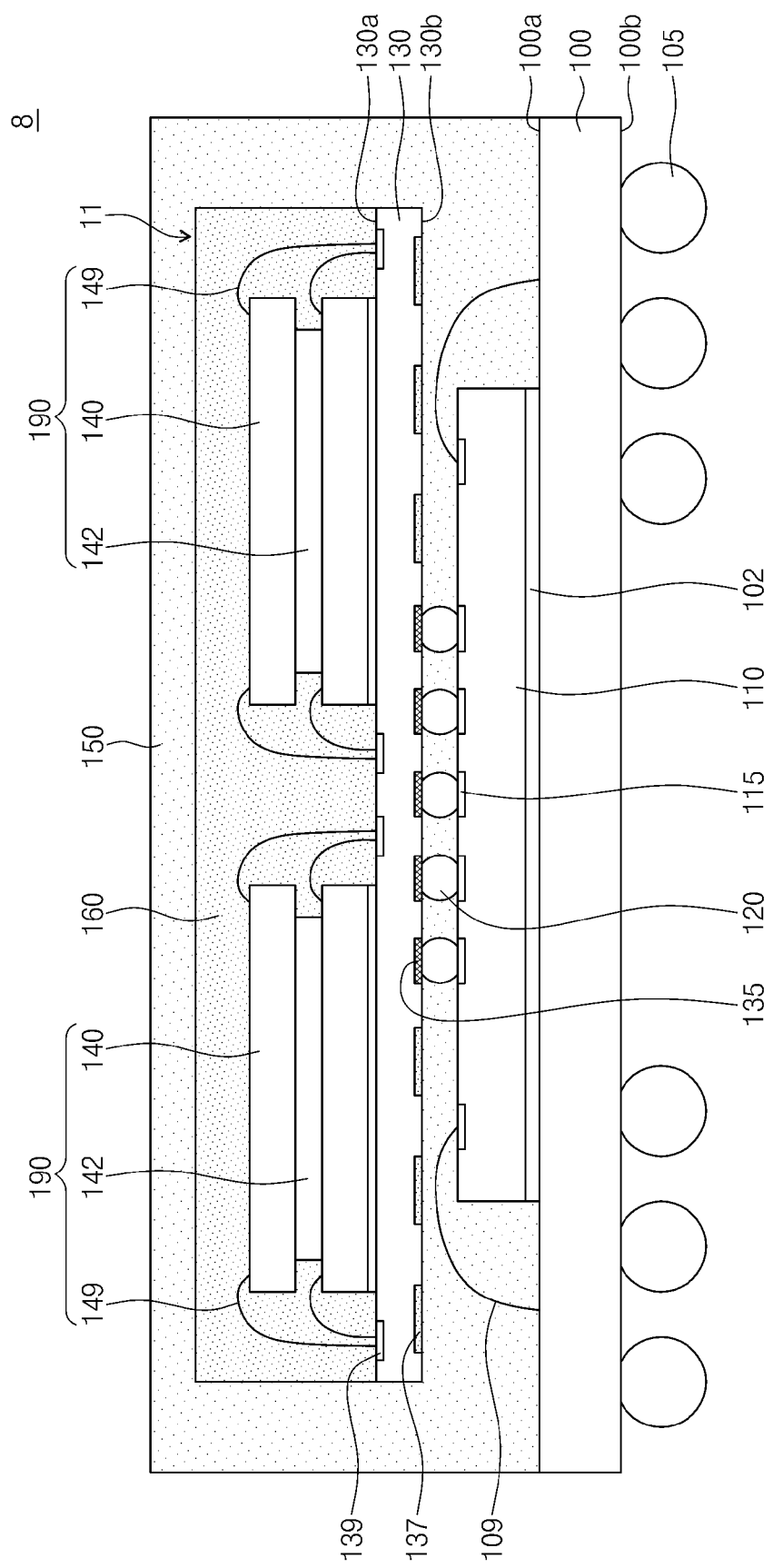

Referring to FIG. 3E, a semiconductor package 8 may include a first semiconductor chip 110 (e.g., a logic chip 110) bonded to a first package substrate 100 in a wire bonding manner and a chip package 11 electrically connected to the logic chip 110 via connection terminals 120. The chip package 11 may include at least two chip stacks 190, each of which is mounted on a second package substrate 130. Each of the chip stacks 190 may include at least one second semiconductor chip 140 (e.g., a memory chip 140) bonded to the second package substrate 130 in the wire bonding manner. The chip stacks 190 may be horizontally arranged on the top surface 130a of the second package substrate 130. In one or more example embodiments, as shown in FIG. 2A, the logic chip 110 may include through electrodes 112 and be mounted on the first package substrate 100 in the face-down manner. In one or more other example embodiments, as shown in FIG. 2D, the logic chip 110 may include through electrodes 113 and be mounted on the first package substrate 100 in the face-up manner.

Figure 3F:
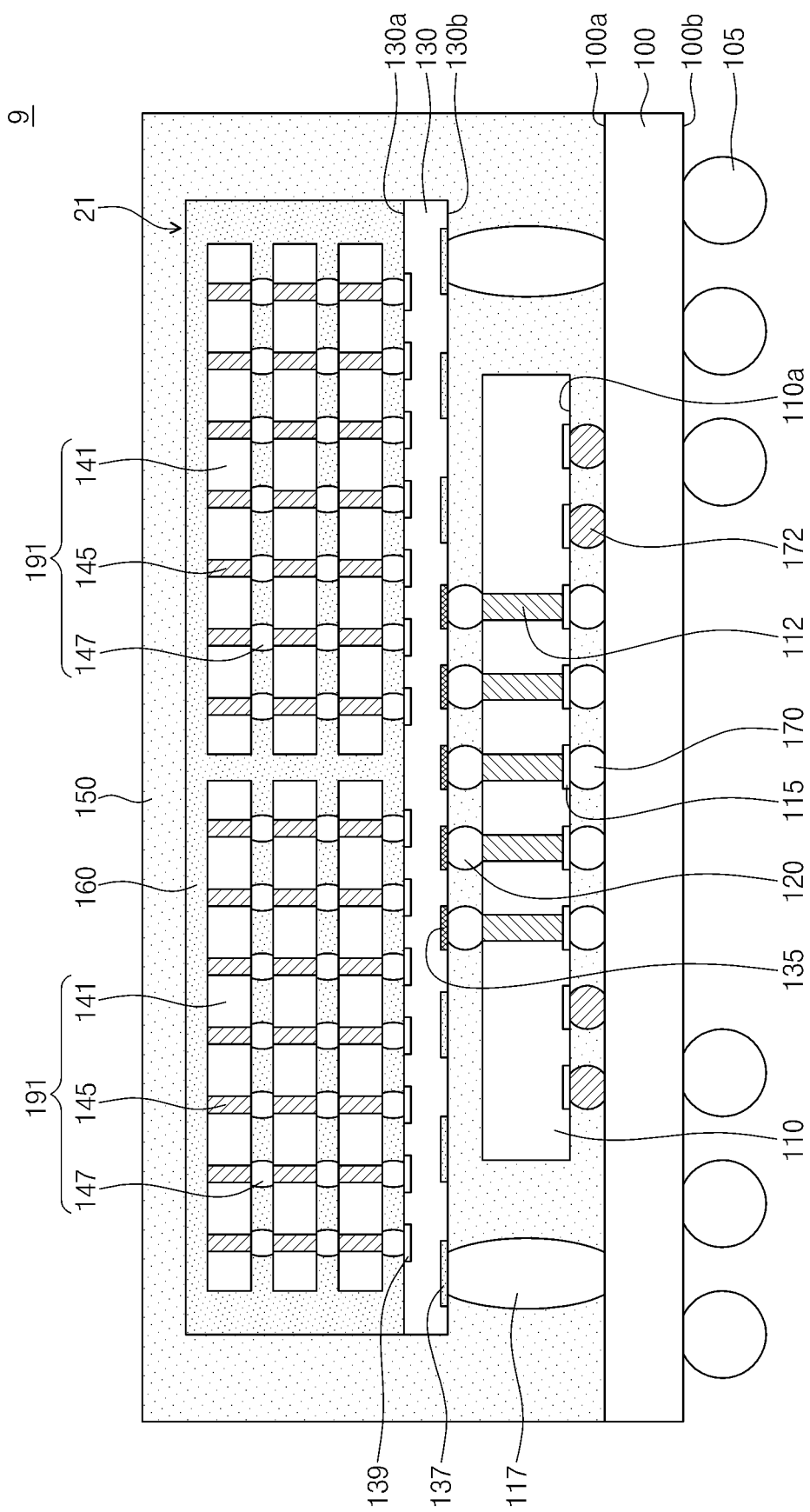

Referring to FIG. 3F, a semiconductor package 9 may include a first semiconductor chip 110 (e.g., a logic chip 110) bonded to a first package substrate 100 in a flip chip bonding manner and chip package 21 electrically connected to the logic chip 110 via connection terminals 120. The chip package 21 may include at least two chip stacks 191, each of which is mounted on a second package substrate 130. Each of the chip stacks 191 may include at least one second semiconductor chip 141 (e.g., at least one memory chip 141) stacked on a second package substrate 130 and including at least one through electrode 145. The chip stacks 191 may be horizontally arranged on the top surface 130a of the second package substrate 130. In one or more example embodiments, as shown in FIG. 2D, the logic chip 110 may include through electrodes 113 and be mounted on the first package substrate 100 in the face-up manner.

Applications of Example Embodiments

Figure 4A:
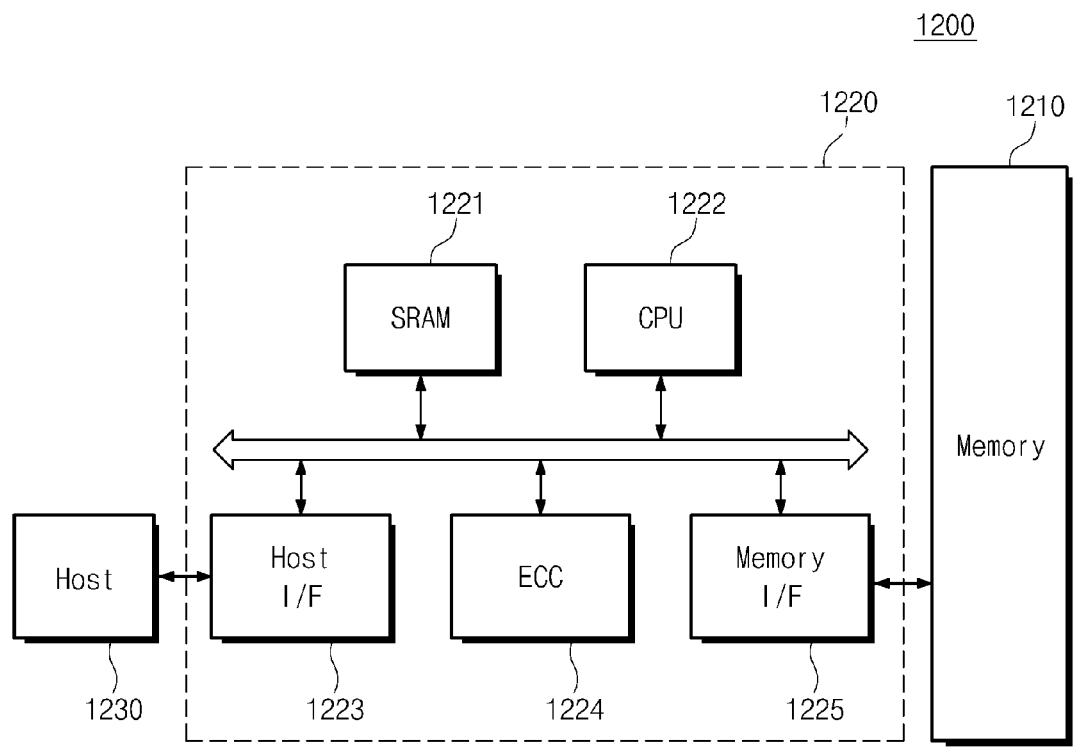
FIG. 4A is a block diagram illustrating a memory card including a semiconductor package according to an example embodiment.
Figure 4B:
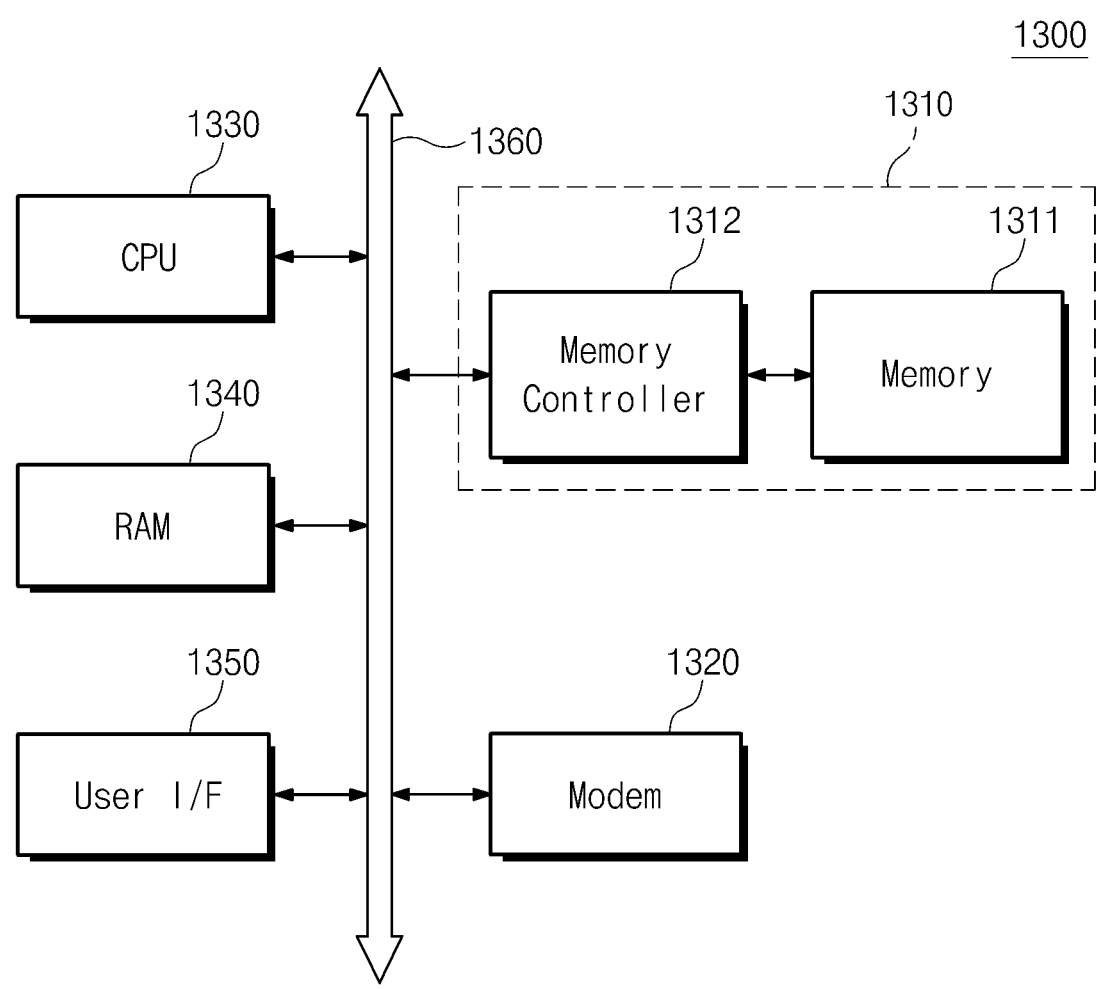
FIG. 4B is a block diagram illustrating an information processing system including a semiconductor package according to an example embodiment.

FIG. 4A is a block diagram illustrating a memory card 1200 including a semiconductor package according to an example embodiment. FIG. 4B is a block diagram illustrating an information processing system 1300 including a semiconductor package according to an example embodiment.

Referring to FIG. 4A, a memory card 1200 may be realized using a memory device 1210 including at least one semiconductor package according to one or more example embodiments (e.g., at least one of the semiconductor packages 1 to 9 according to example embodiments described above). In one or more example embodiments, the memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220.

Referring to FIG. 4B, an information processing system 1300 may be realized using a memory system 1310 including at least one semiconductor package according to one or more example embodiments (e.g., at least one of the semiconductor packages 1 to 9 according to example embodiments described above). For instance, the information processing system 1300 may be a mobile device and/or a desktop computer. In one or more example embodiments, the information processing system 1300 may further include a modem 1320, a central processing unit (CPU) 1330, a RAM 1340, and a user interface 1350, which are electrically connected to a system bus 1360, in addition to the memory system 1310. The memory system 1310 may include a memory device 1311 and a memory controller 1312. In one or more example embodiments, the memory system 1310 may be configured substantially identical or similar to the memory system described with respect to FIG. 4A. Data processed by the CPU 1330 and/or input from the outside may be stored in the memory system 1310. In one or more example embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to one or more example embodiments.

According to example embodiments, since the logic chip is directly connected to the inner stack memory package structure, it is possible to increase an operation speed of the semiconductor package effectively. The inner stack memory package structure includes at least one package substrate serving as an interposer, and therefore, it is possible to easily realize an electric connection between the memory chips and the logic chip, irrespective of an integration density of the memory or logic chip or arrangement of the pads. In addition, the package substrate of the inner stack memory package structure includes at least one test pad having a relatively large pitch, which makes it possible to easily perform a test process on the semiconductor package, and thus, the semiconductor package can be fabricated with high yield or productivity.

While example embodiments have been particularly shown and described, it will be understood by one of ordinary skill in the art that variations in form and detail may be made therein without departing from the spirit and scope of the attached claims.

What is claimed is:

1. A semiconductor package, comprising:
a first semiconductor chip mounted on a first package substrate;
a chip package stacked on the first semiconductor chip, the chip package comprising a second package substrate and a second semiconductor chip mounted on the second package substrate; and
a first terminal connecting the chip package directly and electrically to the first semiconductor chip,
wherein the second package substrate comprises:
a first pad coupled to the first terminal;
a second pad electrically connected to the first pad and electrically spaced apart from the first terminal;
a third pad electrically connected to the second semiconductor and electrically connected to the first pad via the second pad; and
a fourth pad electrically connected to the second semiconductor chip via the third pad, and electrically connected to the first pad via the second pad, wherein:
the third and fourth pads are disposed on an upper surface of the second package substrate on which the second semiconductor chip is mounted,
the first and second pads are placed on a lower surface of the second package substrate opposite the upper surface, and
the fourth pad is fully covered by an upper insulating layer on the upper surface of the second package substrate, wherein the second pad is not directly coupled to the first terminal.

2. The semiconductor package of claim 1, wherein:
the first pad comprises a plurality of first pads, the second pad comprises a plurality of second pads, and the third pad comprises a plurality of third pads; and
the plurality of second pads is each larger in at least one of size and pitch as compared to the plurality of first pads.

3. The semiconductor package of claim 2, wherein a number of the plurality of second pads is equal to a number of the plurality of first pads.

4. The semiconductor package of claim 2, wherein the first terminal comprises a plurality of first terminals interposed between the lower surface of the second package substrate and the first semiconductor chip.

5. The semiconductor package of claim 4, further comprising a second terminal interposed between the first package substrate and the second package substrate, wherein the second terminal is connected to the second pad to connect the chip package directly and electrically to the first package substrate.

6. The semiconductor package of claim 5, wherein the plurality of the first terminals are configured to establish transmission paths of data signals between the first semiconductor chip and the chip package, and the second terminal is configured to establish a transmission path of at least one of a power signal and a ground signal between the first package substrate and the chip package.

7. The semiconductor package of claim 6, wherein the second package substrate further comprises a plurality of first vias connecting the plurality of the second pads electrically with the plurality of the third pads, the plurality of first vias penetrating the second package substrate.

8. The semiconductor package of claim 7, wherein:
the second package substrate further comprises a second via penetrating the second package substrate; and
the second via is electrically connected to one of the third pads and the second terminal to establish the transmission path of the at least one of the power signal and the ground signal between the first package substrate and the chip package.

9. A semiconductor package, comprising:
a first semiconductor chip mounted on a first package substrate;
a chip package stacked on the first semiconductor chip, the chip package comprising a second package substrate and a second semiconductor chip mounted on the second package substrate; and
a plurality of connection terminals provided between the first semiconductor chip and the second package substrate to connect the chip package directly and electrically to the first semiconductor chip,
wherein the second package substrate comprises:
a plurality of connection pads connected to the plurality of connection terminals,
a plurality of test pads connected to the plurality of connection pads and electrically spaced apart from the plurality of connection terminals,
a plurality of bonding pads electrically connected to the plurality of connection pads via the plurality of test pads, and
a plurality of auxiliary pads electrically connected to the plurality of test pads,
wherein the plurality of test pads are arranged on a first surface of the second package substrate with a pitch different from a pitch of the plurality of connection pads, wherein the plurality of test pads are not directly coupled to the plurality of connection terminals,
wherein the plurality of bonding pads are arranged on a second surface of the second package substrate and electrically connected to the second semiconductor chip, and
wherein the plurality of auxiliary pads are arranged on the second surface of the second package substrate and fully covered by an insulating layer on the second surface of the second package substrate.

10. The semiconductor package of claim 9, wherein the first semiconductor chip is a logic chip and the second semiconductor chip is a memory chip.

11. The semiconductor package of claim 9, wherein:
the plurality of connection pads are arranged in a center region on the first surface of the second package substrate and configured to have a first size and a first pitch;
the plurality of test pads are arranged in an edge region located around the center region on the first surface of the second package substrate and configured to have a second size and a second pitch; and
the second size is larger than the first size and the second pitch is larger than the first pitch.

12. The semiconductor package of claim 9, wherein the first semiconductor chip comprises a plurality of first bonding wires electrically connected to the plurality of connection terminals or a plurality of first through electrodes electrically connected to the plurality of connection terminals, and the second semiconductor chip comprises a plurality of second bonding wires electrically connected to the plurality of bonding pads or a plurality of second through electrodes electrically connected to the plurality of bonding pads.

13. The semiconductor package of claim 12, wherein:
the first semiconductor chip is mounted on the first package substrate in a face-down manner such that an active surface of the first semiconductor chip faces the first package substrate or a face-up manner such that the active surface of the first semiconductor chip faces the second package substrate; and
the plurality of first through electrodes are configured to establish a transmission path of at least one of a power signal and a ground signal between the first semiconductor chip mounted in the face-down manner and the chip package or configured to establish an electrical path between the first semiconductor chip mounted in the face-up manner and an external device.

14. A semiconductor package, comprising:
a package substrate; and
a semiconductor chip mounted on the package substrate,
wherein the package substrate comprises:
a connection pad directly and electrically connected to an external semiconductor chip, external to the semiconductor package,
a test pad electrically connected to the connection pad and indirectly electrically connectable to the external semiconductor chip,
a bonding pad electrically connected to the semiconductor chip, and electrically connected to the connection pad via the test pad, and
an auxiliary pad electrically connected to the test pad, the auxiliary pad being fully encapsulated by a second insulating layer on the package substrate, wherein
the connection pad comprises a plurality of connection pads, and the test pad comprises a plurality of test pads; and the plurality of test pads is each larger in at least one of size and pitch as compared to the plurality of connection pads.

15. The semiconductor package of claim 14, wherein:
the package substrate further comprises a core, a first insulating layer covering a first surface of the core, and a second insulating layer covering a second surface, opposite the first surface, of the core; and
the connection pad and the test pad are partially encapsulated by the first insulating layer, and the bonding pad is partially encapsulated by the second insulating layer.

16. The semiconductor package of claim 14, wherein the plurality of connection pads and the plurality of test pads are on a same side of the package substrate.

* * * * *